US009231463B2

(12) United States Patent
Oaklander

(10) Patent No.: US 9,231,463 B2
(45) Date of Patent: Jan. 5, 2016

(54) NOISE RESISTANT REGULATOR INCLUDING AN ENCODED CONTROL SIGNAL

(71) Applicant: Peter Oaklander, Saratoga, CA (US)

(72) Inventor: Peter Oaklander, Saratoga, CA (US)

(*) Notice: Subject to any disclaimer, the term of this patent is extended or adjusted under 35 U.S.C. 154(b) by 54 days.

(21) Appl. No.: 13/841,746

(22) Filed: Mar. 15, 2013

(65) Prior Publication Data
US 2014/0035548 A1 Feb. 6, 2014

Related U.S. Application Data

(60) Provisional application No. 61/680,223, filed on Aug. 6, 2012.

(51) Int. Cl.
G05F 1/00 (2006.01)
H02M 1/08 (2006.01)
H03K 17/06 (2006.01)
H02M 3/157 (2006.01)
H02M 1/44 (2007.01)
H02M 3/158 (2006.01)

(52) U.S. Cl.
CPC .............. *H02M 1/08* (2013.01); *H02M 3/157* (2013.01); *H03K 17/063* (2013.01); *H02M 1/44* (2013.01); *H02M 3/1584* (2013.01)

(58) Field of Classification Search
CPC .............. H02M 3/156; H02M 3/157; H02M 2001/0045; H02M 3/1588; H02M 3/1584
USPC ......... 323/241, 267, 268, 271, 272, 282, 283, 323/284, 285, 286, 322, 350, 351; 363/147; 307/58, 82
See application file for complete search history.

(56) References Cited

U.S. PATENT DOCUMENTS

| 6,144,194 A | 11/2000 | Varga | |
|---|---|---|---|
| 6,268,716 B1 * | 7/2001 | Burstein et al. | 323/272 |
| 6,668,238 B2 * | 12/2003 | Taruya et al. | 702/138 |
| 7,274,175 B2 * | 9/2007 | Manolescu | 323/267 |
| 7,342,528 B2 * | 3/2008 | Ng et al. | 341/153 |

(Continued)

FOREIGN PATENT DOCUMENTS

| JP | 08-098506 | 4/1996 |
|---|---|---|
| KR | 10-1997-0022925 A | 5/1997 |
| WO | WO 2014/025510 A1 | 2/2014 |

OTHER PUBLICATIONS

"Digital Control Compatible Synchronous-Buck Gate Drive With Current Sense and Fault Protection", Texas Instruments, Jan. 2010, UCD7231, www.ti.com.

(Continued)

*Primary Examiner* — Adolf Berhane
*Assistant Examiner* — Alex Torres-Rivera
(74) *Attorney, Agent, or Firm* — HIPLegal LLP; Judith A. Szepesi

(57) ABSTRACT

A converter for supplying a regulated voltage from an input to a load is disclosed. The converter supplies a regulated DC voltage from an input to a load using a power switch driven by a gate driver. It also includes a control loop for carrying a load condition signal and a control signal. The converter also includes a controller located on the control loop that generates the control signal based on the load signal. The controller is located on a first integrated circuit. The gate driver is located on a second integrated circuit. The load condition signal is encoded on the first integrated circuit and is decoded on the second integrated circuit.

22 Claims, 22 Drawing Sheets

(56) References Cited

U.S. PATENT DOCUMENTS

| | | | |
|---|---|---|---|
| 7,365,453 B2 * | 4/2008 | Large | 307/115 |
| 7,394,445 B2 | 7/2008 | Chapuis et al. | |
| 7,459,892 B2 | 12/2008 | Chapuis | |
| 7,469,381 B2 | 12/2008 | Ording | |
| 7,589,505 B2 | 9/2009 | Cheng | |
| 7,629,841 B2 | 12/2009 | Gustat | |
| 7,701,731 B2 | 4/2010 | Dhuyvetter et al. | |
| 7,738,568 B2 * | 6/2010 | Alfano et al. | 375/258 |
| 7,864,546 B2 | 1/2011 | Dhuyvetter et al. | |
| 8,030,911 B2 * | 10/2011 | Nien et al. | 323/283 |
| 8,077,490 B1 | 12/2011 | Prodic | |
| 8,312,371 B2 | 11/2012 | Ording | |
| 2008/0048628 A1 | 2/2008 | Lee | |
| 2008/0129263 A1 * | 6/2008 | Kotikalapoodi et al. | 323/283 |
| 2008/0237354 A1 | 10/2008 | Watanabe | |
| 2008/0266463 A1 | 10/2008 | Fensore et al. | |
| 2009/0027025 A1 * | 1/2009 | Latham et al. | 323/283 |
| 2009/0230874 A1 * | 9/2009 | Zhao et al. | 315/192 |
| 2009/0237966 A1 * | 9/2009 | Soenen et al. | 363/74 |
| 2009/0243575 A1 * | 10/2009 | Akiyama et al. | 323/282 |
| 2010/0079323 A1 * | 4/2010 | Miao | 341/142 |
| 2010/0134040 A1 | 6/2010 | Elder | |
| 2010/0201340 A1 * | 8/2010 | Raghavan | 323/311 |
| 2011/0025284 A1 * | 2/2011 | Xu et al. | 323/282 |
| 2011/0204859 A1 * | 8/2011 | Prodic et al. | 323/271 |
| 2012/0194141 A1 * | 8/2012 | Shi et al. | 320/137 |
| 2014/0002042 A1 * | 1/2014 | Wismar et al. | 323/282 |
| 2014/0035628 A1 * | 2/2014 | Oaklander | 327/109 |

OTHER PUBLICATIONS

Feng et al., "Digital PWM control for isolated DC-DC converters with two pulses modulating PWM", Proc. 24th Annual IEEE Applied Power Electronics Conf. Expo., APEC Feb. 15-19, 2009, pp. 269-279.

Massoud et al., "Modeling and Analysis of Differential Signaling for Minimizing Inductive Cross-Talk", Proceedings IEEE Design Automation Conference, Jun. 2001, pp. 804-809.

Wielage and Goossens, "Networks on Silicon: Blessing or Nightmare?", Proceedings of the Euromicro Symposium on Digital System Design, Sep. 4-6, 2002, pp. 196-200.

PCT International Search Report and Written Opinion of the International Searching Authority, or the Declaration for PCT/US2013/051220, mailed Nov. 27, 2013, 12 pages.

PCT International Preliminary Report on Patentability for PCT/US2013/051220, issued Feb. 10, 2015 (8 pages).

* cited by examiner

NOISE RESISTANT REGULATOR INCLUDING AN ENCODED CONTROL SIGNAL

CROSS REFERENCE TO RELATED APPLICATIONS

This application claims the benefit of U.S. Provisional Application No. 61/680,223, filed Aug. 6, 2012, which is hereby incorporated by reference. This application has been filed concurrently with related U.S. patent application Ser. No. 13/841,939, which is hereby incorporated by reference.

BACKGROUND OF THE INVENTION

DC to DC (DCDC) converters convert a source of direct current (DC) from one voltage level to another. They are important in portable and non-portable electronic devices including, for example, cellular phones, laptop computers, industrial controls and wireless base stations. Such electronic systems often contain several sub-systems, each with its own voltage level requirement different from that supplied by a battery or external supply. In any circuit arrangement, noise arises from high speed data lines, fast clock edges or inductive magnetic coupling that may affect other circuitry. As circuits and their connections become more highly integrated either on dense printed circuit boards (PCBs) or in integrated circuits (ICs), noise becomes more problematic due to the close proximity of neighboring circuits and lines. In applications requiring high frequency circuits, problems associated with noise become even more pronounced. As demand for faster speeds and ever more highly integrated systems grows, noise has an increasing impact and becomes a limiting factor. These kinds of issues are prevalent in DCDC converters in which ever more precise voltages are needed with low output noise as load voltages are reduced to lower system power and fast signal transitions create a rich environment for noise related design problems.

BRIEF SUMMARY OF THE INVENTION

Embodiments of the invention are directed to a noise resistant DCDC converter. The converter supplies a regulated DC voltage to a load using a power switch driven by a gate driver. It also includes a control loop for carrying a load condition signal and a control signal. The converter also includes a controller located on the control loop that generates the control signal based on the load signal. The controller is located on a first integrated circuit. The gate driver is located on a second integrated circuit. The load condition signal is encoded on the first integrated circuit and is decoded on the second integrated circuit.

Other embodiments of the invention are directed to a converter for supplying power from an input to a load. The converter includes a feedback path for controlling the converter—at least a portion of which carries a load condition signal. The converter also includes a decoder for decoding an encoded load condition signal to produce a decoded load condition signal. The decoded load condition signal is used to generate a control signal to control the converter. The converter also includes an encoder for encoding the load condition signal to produce the encoded load condition signal. The load condition signal and the encoded load condition signal both represent a condition of the load. The decoder is located on a first integrated circuit. The encoder is located on a second integrated circuit.

Other embodiments of the invention are directed to an apparatus comprising a converter for providing a regulated voltage to a load. The apparatus also includes a control loop for routing a signal and controlling the converter. The apparatus also includes an encoder for encoding the signal to produce an encoded signal; and a decoder for decoding the encoded signal to produce a decoded signal. The encoder and the decoder are located on different integrated circuits. The signal and the decoded signal have the same informational content.

DETAILED DESCRIPTION OF THE INVENTION

Figure 1:
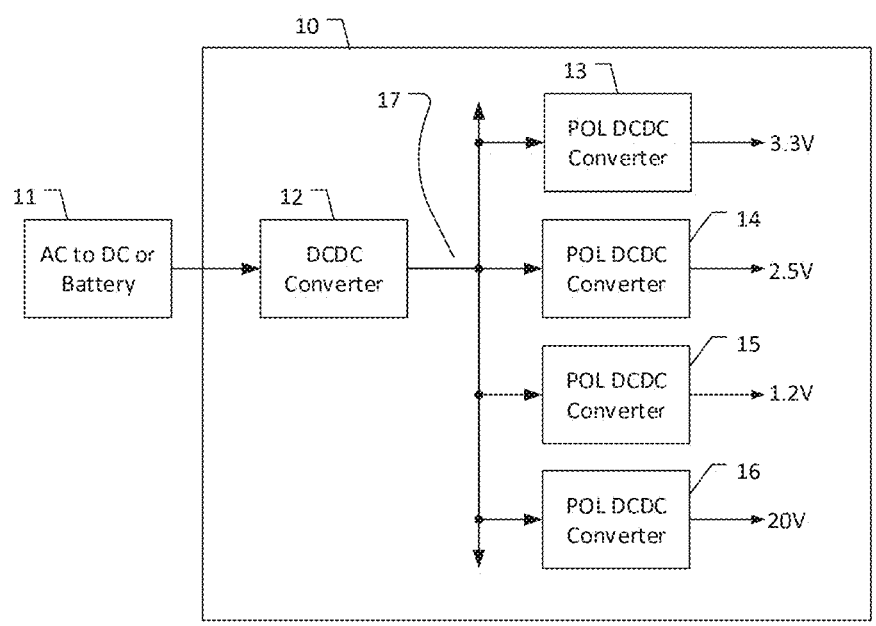
FIG. 1 depicts a power supply system using an intermediate bus DCDC converter driving multiple POL DCDC converters.

In electronic systems, it is common to require DC power from a source such as an AC to DC converter or battery to be converted into several discrete voltage and current levels to supply power to the system. FIG. 1 illustrates an environment that could contain embodiments of the present invention. In FIG. 1, several subsystems on a PCB 10 may be powered by an AC to DC converter or battery 11. This output voltage level can be quite large and must be lowered and distributed to several sub-systems or components such as a microprocessor ("MPU"), a memory, or an analog component. These sub-systems or components generally require lower supply voltages such as 3.3V, 2.5V, or 1.2V. In addition, it may be that a higher voltage such as 20V is required for some sub-systems or components such as a display. For such cases, a DCDC converter 12 may be used to change the voltage down, and provide different output voltage or current levels to these various components or sub-systems.

The sub-systems or components that use the distributed power from the DCDC converter(s) may each be thought of as a load for the DCDC converter. The term Point-Of-Load ("POL") DCDC converters refer to those DCDC converters that are directly driving their associated loads. FIG. 1 illustrates POL DCDC converters 13, 14, 15, and 16 coupled to DCDC converter 12. As seen in FIG. 1, a DCDC converter does not need to be a POL converter. For example, DCDC converter 12 is used to convert an input voltage to an intermediate voltage on an intermediate bus 17 that then feeds one or more loads, such as POL DCDCs 13, 14, 15, and 16. Each of these loads may in turn produce a separate output voltage or current level for the load. The intermediate DCDC converter 12 may be, for example, a bus DCDC converter or an intermediate bus DCDC converter.

DCDC converters can be utilized in numerous alternative topologies. For example, the DCDC converter may be configured to: reduce the input voltage at the output as in the so-called "Buck" circuit; increase the input voltage at the output as in a "Boost" circuit; or to produces an output voltage that is either higher or lower than the input voltage as in a "Buck-Boost" arrangement.

Figure 2:
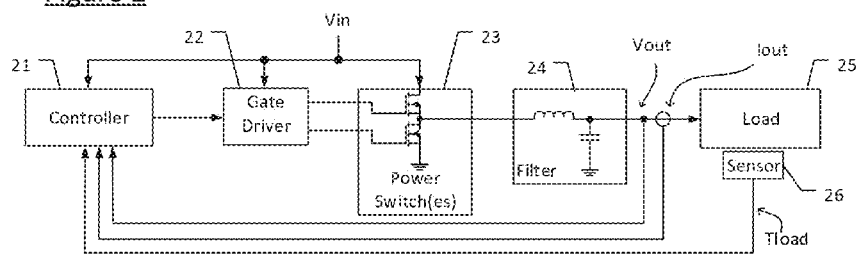
FIG. 2 depicts a block diagram of a DCDC converter.

FIG. 2 illustrates one arrangement of the general sub blocks of a simplified DCDC converter that can be used in place of the DCDC converters in FIG. 1. The DCDC converter may be a bus converter or POL converter. A controller 21 is provided that outputs a pulse width modulation ("PWM") or pulse frequency modulation ("PFM") signal that drives gate driver 22. The signals output by this controller can more generally be referred to as converter control signals. The PWM signal may include signaling that enables diode emulation ("DE") mode which is a variation of PWM signaling that improves light load efficiency. In any event, gate driver 22 serves to increase the drive power of the controller's PWM/PFM/DE signals in order to drive the large capacitive load associated with power switch(es) 23. These power switch(es) may comprise one or more power switching devices such as silicon FETs, SiC FETs or GaN FETs. Power switch(es) 23 as shown in FIG. 2 are configured in synchronous buck mode. However, with minor modifications they may be configured in other ways such as using only one FET and one diode in a non-synchronous architecture or in a boost or buck-boost topology.

To continue with the discussion of FIG. 2, a filter 24 may be included to smooth the switch node signal at the output of power switch(es) 23. The node at the output of power switch(es) 23 is called the switch node. The signal at the switch node is highly variant. The filter changes this signal into a DC output voltage with a small amount of noise or ripple which is applied to load 25. It is desirable to reduce the noise or ripple applied to the load 25 especially for cases where the load voltage is very small such as for advanced deep submicron ICs.

In order to regulate the output voltage, a control loop may be provided as shown to provide feedback signals sampled from the DCDC output or load 25. This control loop also includes controller 21 and the route the signals generated by controller 21 follow to reach power switches 23 as described below. The feedback signals sampled from the DCDC output of load 25 may include the output voltage (Vout), current delivered to the load (Iout) or local temperature at the load (Tload). This class of signals are more generally called load condition signals, but they are sometimes referred to herein as feedback signals. In some cases, a sensor 26 may be used to measure Tload. FIG. 2 illustrates a situation where the Iout signal is sensed by an ideal current sensor at the output of filter 24. However, the current may be fed back from either the power switch(es) 23, the parasitic resistance of the inductor in filter 24, or from a sense resistor in series with filter 24 and load 25. A sense resistor in series with the power or ground pin of power switch(es) 23 or a "pilot MOSFET" mirroring the power MOSFET current in one or both of the power switch(es) 23 may also be provided to generate an Iout signal. Another scheme is to measure the Vds voltage across the MOSFET in the power switch(es) 23. Feeding back the Vout, Iout, and or Tload to the controller forms a closed loop system and keeps the DCDC converter stable.

DCDC converters are sensitive to the placement of the component blocks because the overall system is noise sensitive. The controller's PWM/PFM/DE signals and the Iout and Vout feedback signals are particularly sensitive to corruption from nearby noise from sources such as electronic components or circuit traces conveying signals with fast edges. To mitigate this problem, the major blocks of a DCDC converter can be laid out close to each other and to the load 25. For example, controller 21 could be laid out close to gate driver 22, and gate driver 22 could be laid out close to power switch(es) 23, filter 24, and load 25. However, it is not always possible to achieve this close layout. In particular, it is difficult to achieve this close layout in a PCB environment because there is generally a lack of available PCB area near the load.

Figure 3:
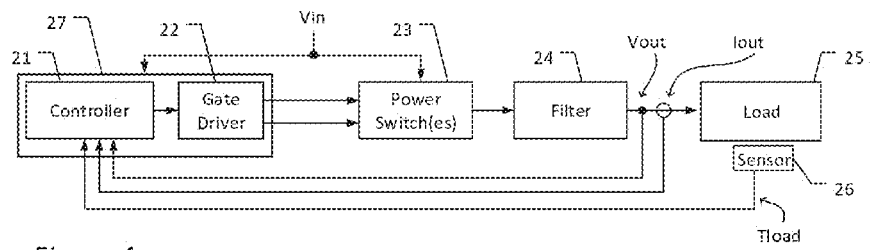
FIG. 3 depicts a DCDC converter with an integrated controller and gate driver in one IC package.
Figure 4:
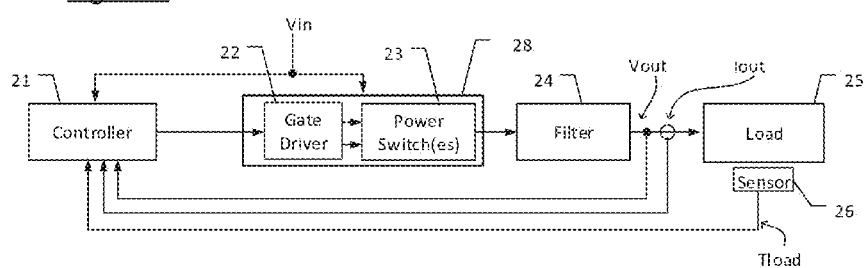
FIG. 4 depicts a DCDC converter with an integrated gate driver and power switch(es) in one IC package called a power stage, driver MOS or Dr. MOS.
Figure 5:
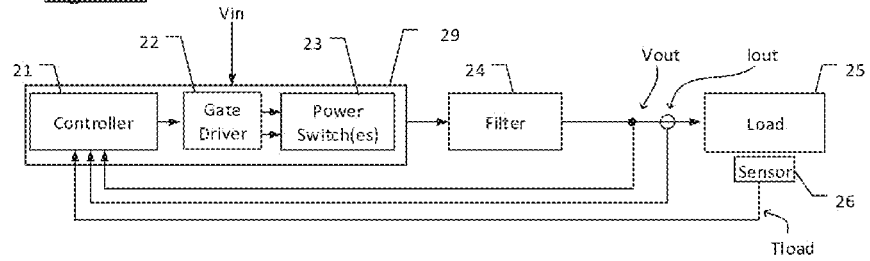
FIG. 5 depicts a DCDC converter with an integrated controller, gate driver and power switch(es) in one IC package called an integrated FET DCDC regulator.

In DCDC converters using IC's the gate driver 22 and power switch(es) 23 can be implemented in at least four configurations. In the first configuration depicted in FIG. 2, gate driver 22 is in a separate IC package from controller 21 and power switch(es) 23. FIG. 3 depicts a second configuration in which gate driver 22 is integrated with controller 21 in an IC package 27. FIG. 4 depicts a third configuration in which gate driver 22 and power switch(es) 23 are integrated into one IC package 28. The combination of the gate driver 22 and power switch(es) 23 in a single IC package can be referred to as a power stage or driver MOS or Dr. MOS 28. Note that power stage 28 may be used to generate an Iout signal to be fed back to controller 21. FIG. 5 depicts a fourth configuration in which controller 21, gate driver 22, and power switch(es) 23 are integrated in a single IC package 29. The combination of blocks in one IC package shown in FIG. 5 is called an integrated FET regulator 29. In any of these arrangements, a single IC package may integrate the components either monolithically or through the co-packaging of separate dice. These dice do not need to be limited to silicon as they can comprise other semiconductor compounds such as SiC or GaN. In the case of separate dice, the co-packaged dice can comprise different types of semiconductor compounds. Finally, the entire DCDC converter using configurations shown in FIGS. 2-5 along with filter 24 and temperature sensor 26 may also be implemented in a single package where all of the blocks are co-packaged on a PC board, a co-packaged separate dice IC package, or integrated monolithically. The resulting combination of blocks is called a power module.

Figure 6:
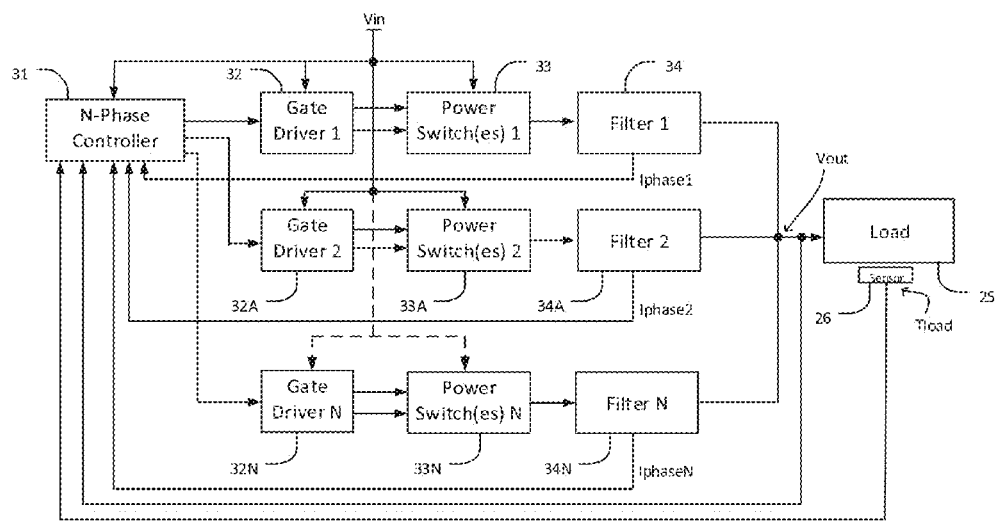
FIG. 6 depicts a block diagram of an N-phase POL DCDC converter.

There are instances where a single DCDC converter cannot provide enough output current to meet the need of a load such as an advanced MPU or custom application specific IC ("ASIC"). In these cases, a multi-phase DCDC converter such as the one depicted in FIG. 6 may be utilized. The N-phase controller 31 may have anywhere from two to N phases. Each phase may include a gate driver such as 32, 32A, and 32N; power switch(es) such as 33, 33A, and 33N; a filter such as 34, 34A, and 34N; and other discrete components. The output voltage Vout is fed back once while the output phase current Iphase from each phase is measured and fed back to the N-phase controller 31. A temperature sensor 26 for measuring the temperature of load 25 may also be applied in the N-phase arrangement to produce a feedback signal. With this arrangement, a combined current may be configured to provide sufficient output current for a high current application. The individual phases may be of different configurations than that shown, and each phase can be of a different configuration than each other phase.

Figure 7:
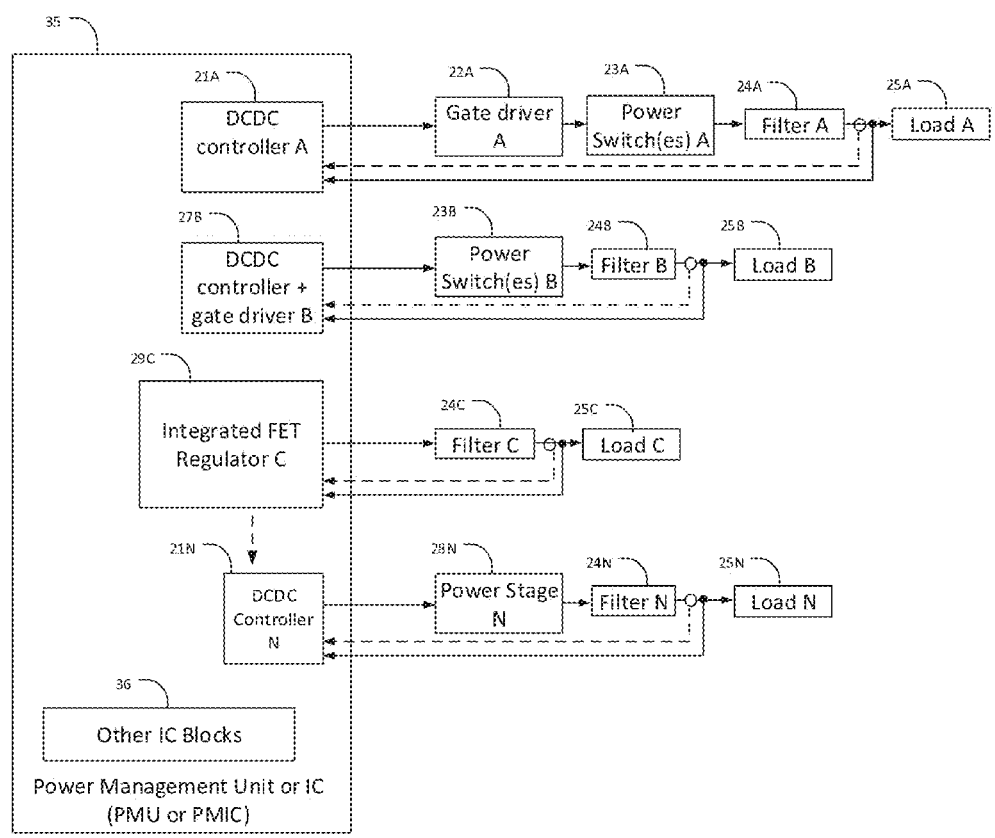
FIG. 7 depicts a power management unit or IC with multiple DCDC converters in one IC package.

FIG. 7 illustrates the case where the examples of FIGS. 2-5 are applied to a POL DCDC configuration. Referring to FIG. 1, the configuration shown in FIG. 7 can provide all the POL DCDCs 13, 14, 15, and 16, with a single channel of DCDC conversion supplying one output voltage to each load. In this arrangement, different channels of DCDC conversion can be generated by a combination of independent DCDC controllers 21A, DCDC controllers integrated with gate drivers 27B, and integrated FET regulators 29C all combined in a single IC package 35 for driving loads 25A, 25B, 25C, and 25N. A multi-channel DCDC converter in a single IC package is referred to as a power management unit ("PMU") of a power management IC ("PMIC"). IC package 35 can include additional IC blocks 36 that are not associated with any particular regulator. FIG. 7 illustrates a multi-channel DCDC converter 35 that could be either a PMU or a PMIC. PMUs and PMICs may or may not include integrated gate drivers and power switches. PMU or PMIC controllers such as the ones located in DCDC controller 21A, DCDC controller 21N, or DCDC controller integrated with gate drivers 27B, or could be used with external but separate gate drivers 22A, power switches 23A and 23B, or power stages 28N. Filters may also be provided internal to the PMU or PMIC though they are illustrated to be located externally in FIG. 7 as filters 24A, 24B, 24C, and 24N.

As already mentioned, DCDC converters can radiate switching noise that can impact other circuits; and several of the signals in a DCDC converter are particularly sensitive to noise coupled into the DCDC converter from nearby sub-circuits, high speed digital buses, and other noise sources. Due to both the proclivity of a DCDC converter to generate noise, and the sensitivity of a DCDC converter to noise, much care is needed to tune the layout of a DCDC converter and nearby circuitry to make sure the converter remains stable and the power supply is not corrupted by noise. In addition, placing the power stage of the DCDC converter away from sensitive circuits is required as they can generate large transients with high currents circulating around the PCB in close proximity. Tuning is achieved by setting restrictions on signal level and possibly frequency, as well as adjusting the layout of the DCDC converter and nearby circuitry. These problems are exacerbated in dense circuits and high speed applications because layout flexibility decreases with density and both problems exacerbate the noise issues. Typically, engineers spend a considerable amount of time tuning filter 24 and adjusting the layout of the DCDC converter and surrounding components to reduce noise sensitivity. However, this design problem is approaching a hard ceiling—sensitivity to noise will be unacceptable as circuits become more condensed and speed specifications continue to increase.

Figure 8:
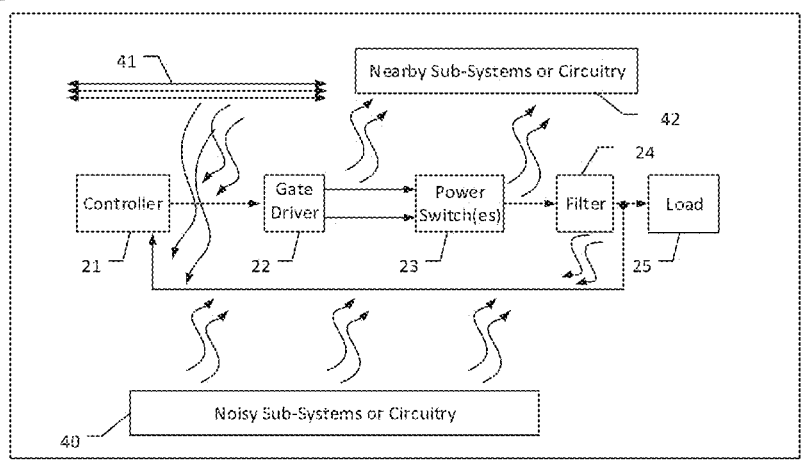
FIG. 8 depicts the layout of a DCDC Converter on a PCB showing radiated and coupled noise sources.

In order to better appreciate the relative complexity of the situation described above, various sources of noise in a DCDC converter will now be discussed with reference to FIG. 8. While FIG. 8 illustrates a PCB, the noise situation is equally applicable to an IC arrangement. In many DCDC converters such as the one shown in FIG. 8 there is significant noise radiated by the PWM/PFM/DE signals from controller 21, gate driver 22 and/or power switch(es) 23. The noise output can be coupled into nearby sub-systems or circuitry 42 on the PCB. This noise can interfere with or corrupt the functioning of sub-systems or circuitry 42. In turn, the PWM/PFM/DE signals output from controller 21, gate driver 22 or power switch(es) 23 can be interfered with or corrupted by noise coupled from nearby sub-systems or circuitry 42 or buses 41. This is particularly true when nearby buses or signal traces carry signals with fast edges such as digital data buses or clocks. Finally, the DCDC converter will produce noise that interferes with its own operation as significant noise may arise from the magnetic coupling from an inductor in filter 24. The feedback signals Vout, Iout, Tload etc. are also sensitive to coupled noise from nearby noisy sub-systems or circuitry 40, nearby signal traces with fast edges 41, magnetic coupling from the inductor in the filter 24, or wideband noise present on most traces in a system—particularly in a PCB. The inductive coupling from filter 24 requires much care because the inductor is an integral part of the DCDC converter and thus must be laid out close to the power switch(es) and load 25 and thus the sensitive feedback signals such as Vout, Iout, and Tload.

Figure 9:
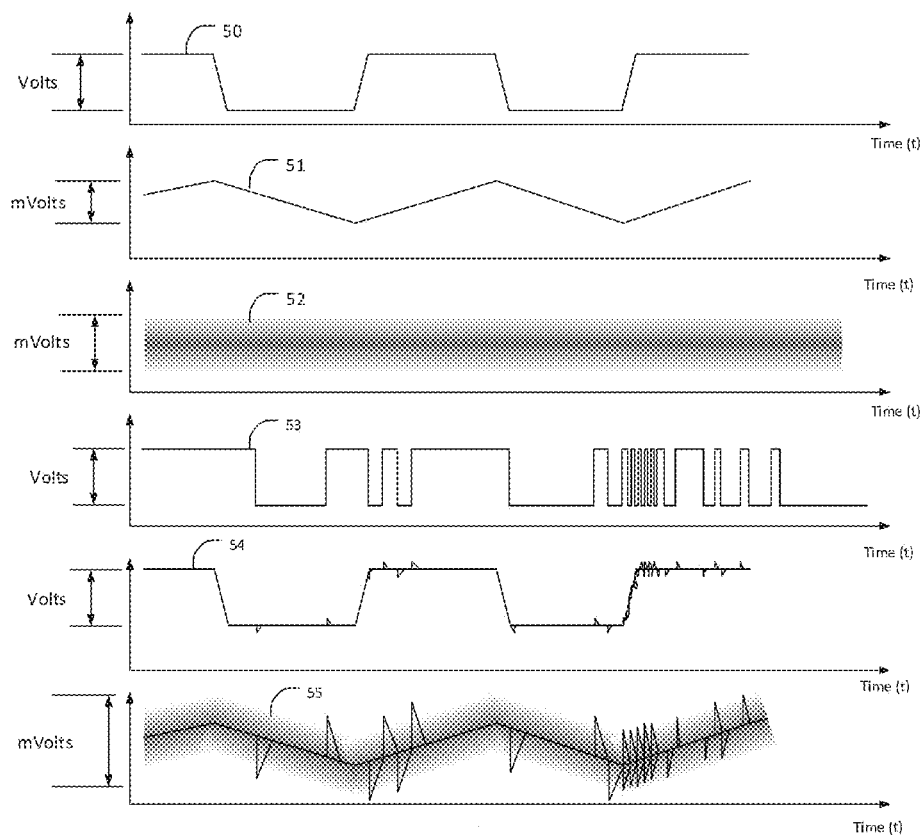
FIG. 9 depicts ideal PWM/PFM/DE and Iout sense waveforms in a DCDC converter and the effect of noise sources on those waveforms.

The noise situation is complicated further by the fact that the noise sources described have different effects on the signals. In particular, fast edge, inductive noise, and wideband noise all affect the signals differently and are therefore difficult to filter out. FIG. 9 illustrates an ideal load condition signal 51 and an ideal control signal 50. The load condition signal may be a low amplitude signal in the mV range due, in the specific instance when the load condition signal is an Iout signal, to the low resistance value of the inductor parasitic or Rsense used for output current sensing. Staying with the example of an Iout signal, the amplitude of the ideal converter control signal 51 drops as the DCDC converter's Iout drops from heavy to light load conditions. The Iout sense 51 signal's peak-to-peak amplitude may be very similar to the peak-to-peak wideband noise indicated by reference numeral 52 or the peak values of inductor coupled or digital noise. The filter itself serves as a source of inductor coupled noise. If the load condition signal is bused along a long PCB trace nearby to noisy sub-systems or circuitry, or traces with fast edges such as the signal shown by reference numeral 53, noise from these sources can be coupled into the signal. As shown in FIG. 9, the magnitude of the noise coupled signals 55 can be significant versus the signal magnitude of the ideal load condition signal 51. The effect of these noise sources on the ideal control signal 50 is also shown at 54. Note that the wideband noise is less problematic for this class of signals because they vary on the range of volts in this example rather than on the range of millivolts. Noise plays a significant factor on the load condition and converter control signals. Solutions that could at once provide the potential to eliminate—or at least appreciably mitigate—the effects of various sources of noise would remove the hard ceiling that the associated designs are approaching.

Noise sources that are localized due to noisy sub-systems or circuitry 40 can be mitigated with careful layouts by routing load condition and converter control signals far away from noise sources. However, it is not always possible to route signals around noise components, and the further a signal is routed, the more opportunity there is for noise to couple in to the trace that is routing the signal. Also, avoiding certain noisy sub-blocks with additional routing creates more situations where the line used to route the signal crosses a noisy signal line. Furthermore, wideband noise source or localized magnetic coupling is hard to avoid in a standard DCDC converter layout. In particular, the filter 24 comprises an inductor that is an integral part of the DCDC converter and thus must be laid out close to the power switch(es) 23 and the load 25. Since the load condition signals are usually generated at the load, they are also usually exposed to this kind of noise regardless of how the signals are routed. In short, in some cases it is unavoidable for the load condition and converter control signals to avoid crossing a noisy trace 41, being routed near a noisy sub-system or circuitry 40, or being exposed to inductive coupling from filter 24. Noise issues can also be mitigated by keeping the load and POL converter close. However, this is not always possible due to the fact that a load will often need to be placed close to other blocks. In addition, this approach does not alleviate the problem caused by filter 24 because the filter is a part of the converter itself.

Figure 10:
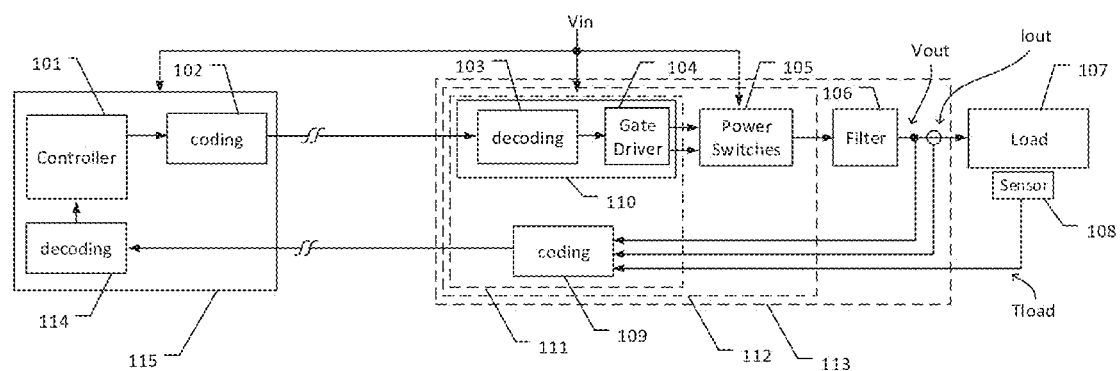
FIG. 10 depicts a noise resistant DCDC converter.

This description provides solutions that solve many of the problems described above and provide additional benefits. FIG. 10 discloses a noise resistance DCDC converter. The converter includes a controller 101 that generates control signals to keep the output of the converter regulated. The controller 101 could be an analog controller, processing analog load condition signals or a digital controller processing digitized load control signals or a hybrid of both types such as an analog controller which processes analog load condition signals but which includes a separate analog to digital converter (ADC) that provides digitized control signals or various voltages to other blocks in the system. The control signals are encoded by encoder 102 and are then routed to decoder 103. The decoded signals are then provided to gate driver 104 which amplifies the signals to control power switch(es) 105. The amplified control signal applied to the power switch(es) 105 control the voltage or current level provided to load 107. Controller 101 generates its control signals based on load condition signals it receives through the feedback path. The load condition signals are generated in any of the ways described above and could be a Vout, Iout, or Tload or other signals generated by a sensor 108. These control signals can then be encoded by encoder 109. Note that decoder 103 and gate driver 104 can be integrated into a single IC package 110 as described above. Furthermore, encoder 109 could be integrated into the same package as the blocks in IC package 110. The resulting IC package can be called a smart driver 111. The smart driver 111 can exhibit all the variations described above with respect to multiple options for an IC package. Further still, the smart driver 111 can be integrated into the same package as the power switch(es) 105. The resulting IC package can be called a smart power stage 112. The smart power stage 112 can exhibit all the variations described above with respect to multiple options for an IC package. Finally, the smart power stage 112 can be integrated into the same package as filter 106 and, in some cases, sensor 108. The resulting integrated circuit package 113 can exhibit all the variations described above with respect to multiple options for an IC package. The signal encoded by encoder 109 is ultimately routed through the feedback path of the converter to controller 101. Controller 101 could be integrated in the same IC package as encoder 102 and decoder 114. The resulting IC package can be called a smart controller 115. The smart controller 115 can exhibit all the variations described above with respect to multiple options for an IC package. Therefore, in some cases the routing between encoder 109 and decoder 114, and the routing between encoder 102 and decoder 103 will be across the traces on a PCB or any other system used to route signals between integrated circuits.

Some of the solutions described with references to FIG. 10 are noise resistant because of the encoding of control signals and load condition signals. In their noise resistant encoded format these signals can be routed through a PCB board or any other routing system without being overly affected by noise. Several methods and encoding schemes can be applied to encode the signals routed between encoder 109 and decoder 114, and encoder 102 and decoder 103. Both sets of signals can be encoded using the same encoding, but they also may be encoded using different encoding schemes. Furthermore, only one branch of the control loop may utilize an encoder and decoder while the other does not. For example, only the feedback path portion of the control loop may utilize an encoder and decoder, while the portion of the control loop that routes a control signal does not. The described approaches not only assure that the regulator will function properly, they also alleviate constraints placed on the location of the controller relative to the gate driver and power switches. Various specific examples of such encoding schemes are discussed below.

Figure 11:
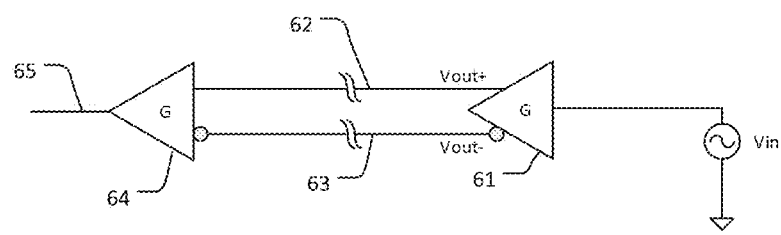
FIG. 11 depicts a system for creating and receiving a differential encoding of a signal.

FIG. 11 depicts a system for differentially encoding and decoding an analog signal to produce a differentially encoded version of that signal for transmission. The system includes an input signal Vin that is coupled to the positive input of a single-ended-to-differential amplifier 61. Amplifier 61 thereby produces a positive version of input signal Vin on positive output 62 and a negative version of input signal Vin on negative output 63. Both of these versions of the signal will also be multiplied by the gain of amplifier 61 which can be used to gain up low level signals like Iout. The two versions of the signal are then routed to the positive and negative inputs of a differential-to-single-ended amplifier 64. Since the negative version of the signal is routed to the negative input of amplifier 62 the resulting signal on output 65 will be the original input signal multiplied by the gain of amplifier 61 multiplied by the gain of amplifier 64. In this example, encoder 120 is amplifier 61 while decoder 114 is amplifier 64. The reason the encoding is noise resistant is that any noise that couples into negative output line 63 will most likely also couple into positive output line 64. Therefore when the signals on the two lines are subtracted from each other by amplifier 64, the noise on each line will cancel the other one out.

Differential encoding can be used with any of the converters described above. Furthermore, differential encoding may be used for the PWM/PFM/DE signal output from the controller IC package and fed to the gate driver. Differential encoding may also be used for the feedback signals Vout, Iout, and Tload or other signals that are output from the gate driver, power switch(es), filter, load or temperature sensor that are fed back to the controller IC package.

The converter control signals and load condition signals can also be encoded digitally. Digitally encoded signals are less sensitive to noise because they have increased voltage swings as compared to analog signals. Digital signals generally swing from ground to supply and do not rely on intermediate voltages to carry information. Digital encoding can also be used in combination with differential and LVDS encodings. Such encodings are herein referred to as differential digital signaling. LVDS may be particularly useful in peripheral component interconnect express (PCI Express) applications that typically require low voltage. Furthermore, the use of PWM/PFM/DE converter control signals can be beneficially applied because these kinds of control signals are less resistant to noise sources than other kinds of control signals. PWM/PFM/DE signals may be in the 1 to 12 V range while the noise coupled to them may be in the mV to V range.

Figure 12:
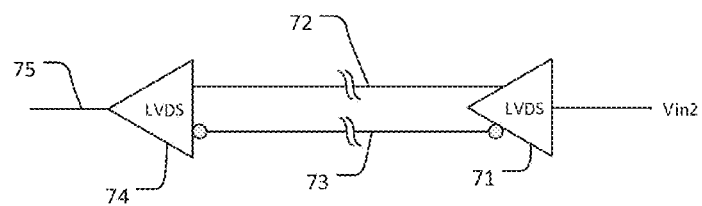
FIG. 12 depicts a system for creating and receiving a low voltage differential signaling encoding of a signal.

FIG. 12 depicts a system for encoding and decoding a signal using low voltage differential signaling (LVDS) to produce an LVDS version of a signal for transmission. LVDS is a differential signaling system, meaning that it transmits information as the difference between the voltages on a pair of wires; the two wire voltages are compared at the receiver. In a typical implementation, the transmitter injects a constant current of 3.5 mA into the wires with the direction of current determining the digital logic level. The current may pass through a termination resistor of about 100 to 120 ohms (matched to the cable's characteristic impedance to reduce reflections) at the receiving end, and then returns in the opposite direction via the other wire. From Ohm's law, the voltage difference across the resistor is therefore about 350 mV. The receiver senses the polarity of this voltage to determine the logic level. The low common-mode voltage (the average of the voltages on the two wires) of about 1.2V allows using LVDS with a wide range of integrated circuits with power supply voltages down to 2.5V or lower. LVDS has a low differential voltage of about 350 mV. This low differential voltage consumes very little power compared to other signaling technologies. At 2.5 V supply voltage the power to drive 3.5 mA is only 8.75 mW. In addition, there are variations of LVDS that use a lower common mode voltage.

In FIG. 12, the transmitter is amplifier 71 and the positive output 72 and negative output 73 carry the differential current. The termination resistor is in amplifier 74. In addition, there are variations of LVDS that use a lower common mode voltage. The specifications for LVDS and all variations are incorporated herein by reference. LVDS encodes an input signal Vin using an amplifier 71 to produce a differential current from positive output 72 to negative input 73. Again, as in the case of differential encoding described above, noise that effects both lines equally will cancel out when the differential signal is converted back to a single ended signal. Amplifier 74 receives the current flowing from positive output 72 to negative input 73 and converts that current into an output voltage on output 75. In this example, encoder 120/118 is amplifier 71 while decoder 114/117 is amplifier 74.

Like standard differential signaling, LVDS may also be used for the PWM/PFM/DE signal output from the controller IC package and fed to the gate Driver. In that regard, the LVDS unit is positioned between controller and driver. LVDS may also be used for the feedback signals Vout, Iout sense and Tload or other signals that are output from the gate driver, power switch(es), filter, load or temperature sensor that are fed back to the controller IC package. Various placements of the LVDS unit are possible in the solution and all of the configurations contemplated will be set forth in more detail.

The use of differential signaling and digitally coded signaling allows the controller to be located much farther away from the gate driver, power switch(es), filter and load when laying out a POL DCDC converter on a PCB. This allows greater flexibility in more highly dense integrated circuits, and perhaps more importantly removes or significantly mitigates restrictions on size and density due to noise.

Figure 13:
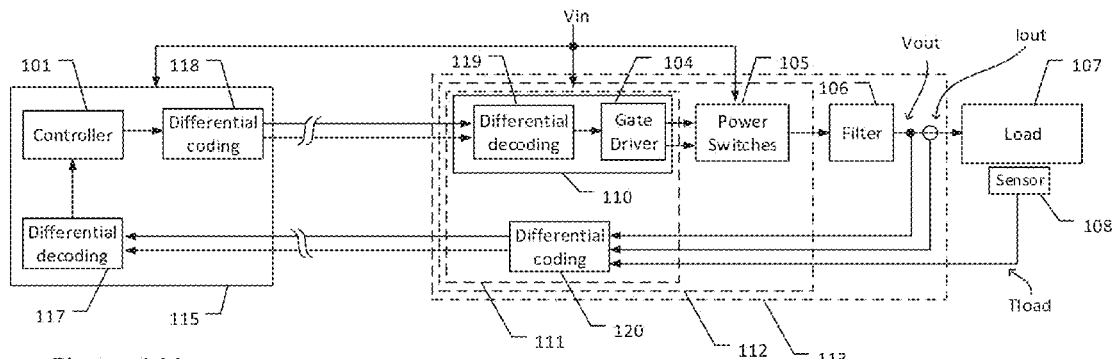
FIG. 13 depicts a noise resistant DCDC converter with differential signaling.

FIG. 13 depicts a noise resistant DCDC converter that utilizes differential signaling between a controller 101 and its corresponding gate driver 104. Power switch(es) 105, filter 106 and load 107 are arranged in that order downstream from gate driver 104. Differential encoder 102 is shown here as being implemented in the same IC package 115 as the controller 101 in order to drive a PWM/PFM/DE signal to the gate driver 104. Differential decoder 119 operates on the same PWM/PFM/DE signal prior to feeding the signal to gate driver 104. Decoding may be performed further downstream beyond gate driver 104.

In FIG. 13, there is defined an IC package with controller 101, differential encoder 118 and differential decoder 117. The illustration is therefore indicative of a solution in which differential signaling is combined with the use of a smart controller 115. FIG. 13 likewise defines an IC package with gate driver 104, PWM/PFM/DE input differential decoder 119 and load condition encoder 120. The illustration is therefore also indicative of a solution in which differential signaling is combined with the use of a smart driver 111. As described above, each smart controller and smart driver may be applied independently.

Differential coding is used for both the load condition signals and the converter control signals in FIG. 13. As depicted, the Vout, Iout and Tload signals of smart driver 111 are sampled and coded into differential signals by differential encoder 120 prior to being fed back to smart controller 115. Differential decoding of the operating mode signals by differential decoder 117 is needed to restore the Vout, Iout, and Tload signals back to their original form to be processed by controller 101. Both smart controller 115 and smart driver 119 can be analog or digital in nature in that the signals between the controller and driver can be analog or coded into a digital representation. Furthermore, this solution applies to both analog and digital control loops. Finally, the differential encoding in FIG. 13 may be an LVDS encoding.

The coding technique described, such as differential encoding (including LVDS), and digital encoding may in the alternative or in addition thereto be used for other parts of the circuit or similar circuit shown in FIG. 13 or in any combination. For example, coding may be employed to desensitize the feedback signals alone or in combination with coding the controller signals. Coding may also be employed in the single-ended signaling for the PWM, PFM, and/or DE output. This could be utilized, for instance if the controller and gate driver 27 or controller and gate driver and power switch(es) 29 are integrated on the same IC. Other specific alternatives include using an analog PWM/PFM/DE signal in a differential format, and using differential or differential digital signaling for the PWM/PFM/DE signal and using traditional separate single-ended analog lines for the control mode signals.

The use of digitally coded data between a smart controller and other blocks of the DCDC converter allows multiple signals to be transmitted and or received serially whereas in other configurations multiple parallel signals are passed back and forth to and from the controller. This has a benefit of reducing the number of PCB traces. This is particularly noteworthy in situations involving digitally coding data between a multi-phase controller and other blocks in the PCB layout of a multi-phase DCDC converter because the number of lines is compounded as the number of phases is increased. Similarly, when using a multi-channel DCDC, such as with a PMU or PMIC 35, there is the possibility of multiple channels being transmitted or received serially. Naturally, reducing lines using digital encoding represents a tremendous savings of both space and fabrication costs in multi-phase configurations.

Both analog and digital application of the solution provided have advantages. For example, an analog arrangement would require minimal circuitry. On the other hand, a digital solution adds further noise resistance to the signals in the feedback loop. In addition, digitization offers additional options for coding the signals in the control loop. For example, this additional coding may include FSK coding, or it may also facilitate embedding a clock signal into the digitized signal. Other digital noise resistant coding schemes such as bipolar, return to zero, non-return to zero, spread spectrum and others would be suitable.

The encoding used on signals in the DCDC converter can also be used to embed a clock signal in the encoded signal from the controller to the gate driver. The embedded clock signal may further provide a precise timing window for the timing and sampling signals. These may include the sampling of the load condition signals Iout, Vout, Tload in synchronization with periods of dead time for the gate driver and power switch or other signals in the gate driver or power stage.

Figure 14A:
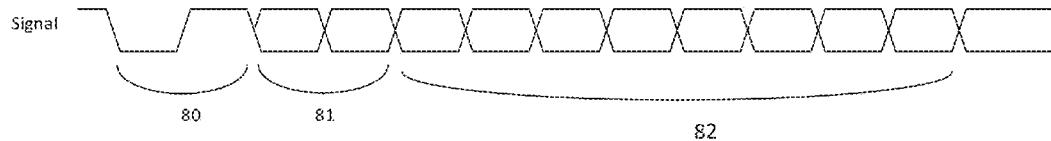
FIGS. 14a and 14b depict two variations of digital signaling.
Figure 14B:
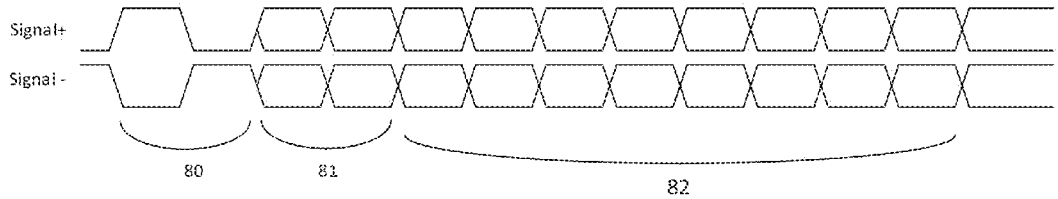

FIG. 14A shows a timing diagram of signals that can be embedded within a coded signal according to an implementation of digital signaling while FIG. 14B depicts a similar serial digital differential signaling using LVDS or other means. In FIG. 14B, the two signal lines, for example, code an 8 bit word 82 corresponding to the PWM/DE duty cycle, a PFM number of pulses per clock cycle 81, or a clock signal 80. FIG. 14A shows an embodiment using a similar, but single ended, encoding. These signals could be embedded and communicated between smart controller 115 and other blocks in the DCDC converter in FIG. 13.

The use of differential and digital encoding including LVDS can be applied to numerous kinds of signals. The usage of differential signaling can be applied to, analog, PWM, PFM, DE, serial digital data, sigma delta or delta sigma modulator bit stream, or pulse density modulation ("PDM") formatted converter control and load condition signals.

Figure 15A:
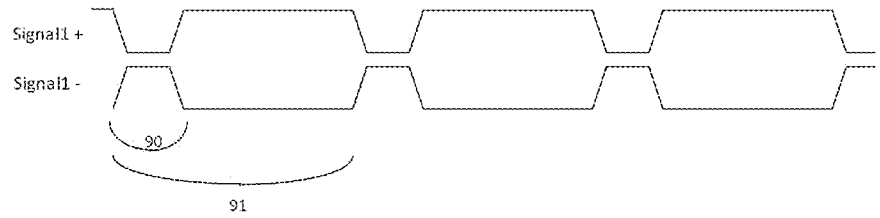
FIGS. 15a and 15b depict two examples of differential analog signaling.
Figure 15B:

FIG. 15A illustrates a timing diagram of a PWM/PFM/DE signal that has been coded using analog differential coding. In the illustrated situation, the signal retains its duty cycle 90 and period 91 after being encoded. An example where an analog differential signaling may be used is in DCDC converters where the slew rate of the PWM signals has been modified and it is desirable to keep this waveform shape faithfully through the single ended to differential coding and differential to single ended decoding. Differential coding of analog signals, PWM/PFM/DE signals, and bitstream/PDM signals may be implemented as shown in FIG. 15A where two differential PWM/PFM/DE signal lines are drawn. FIG. 15B shows an analog differential coding of the Iout signal where ideally the two signals maintain an exact inverted representation of each other with phase amplitude and any waveform shape faithfully transmitted without distortion.

Encoders and decoders as described above may be applied to an N-phase configuration. As described previously, FIG. 6 depicts an exemplary block diagram of an N-Phase DCDC converter. The solutions described above with reference to the single converter in FIGS. 10 and 13 can also be applied to this N-phase controller. The coding and decoding of signals may be applied at various points in the circuit. Notably, the effect of noise from neighboring phases can be mitigated because the feedback lines of each phase can be operated separately and in sequence. The solutions described above are of particular utility in enhancing this benefit as the control signals can be encoded to assure they are utilized in the proper phase. N-phase converters do suffer from an increase in layout constraints and noise coupling due to the fact that multiple lines have to be routed through the circuit to reach the power switches of each of the N-phase regulators, but the solutions discussed above can resolve this issue as well. The situation shall be better understood with respect to FIGS. 16 and 17.

Figure 16:
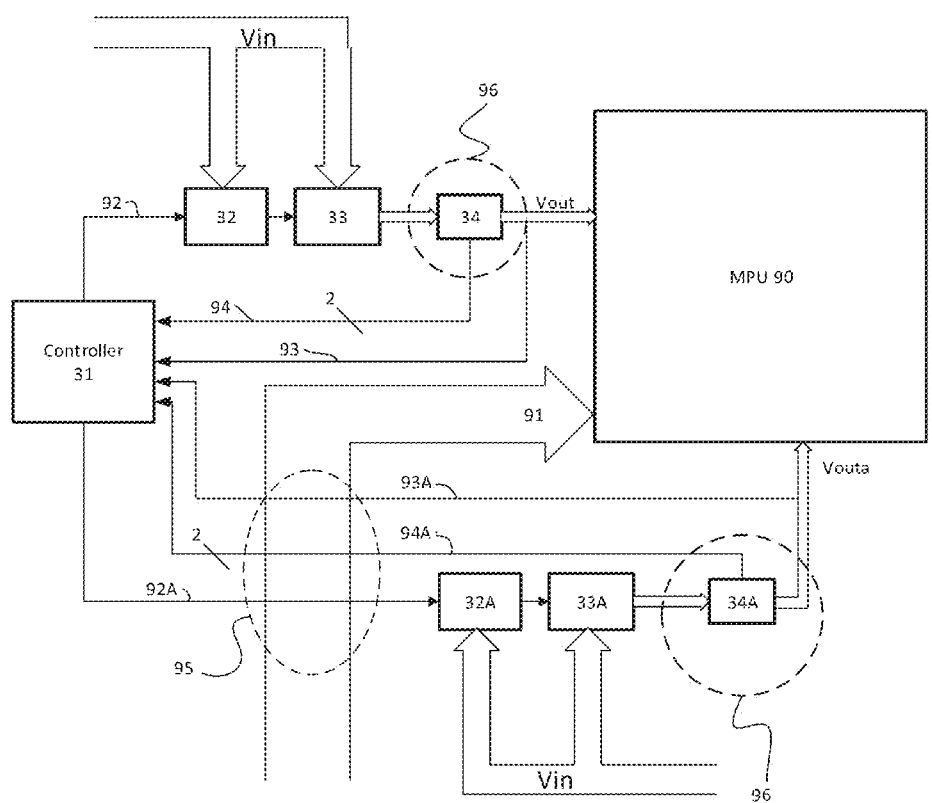
FIG. 16 depicts the layout of an N-phase POL DCDC converter supplying power to an MPU.

FIG. 16 illustrates a PCB layout including an MPU 90 microprocessor supplied by a DCDC converter. The DCDC converter includes an N-phase DCDC converter controller 31. Signaling on the PCB will include multiple parallel traces of various digital data routed on address and I/O signal lines 91 going into or out of the MPU. The Vin and Vout signals going to and from the two gate drivers 32 and 32A, power switch(es) 33 and 33A and filters 34 and 34A are routed with wide traces to avoid IR drops. In FIG. 16, the converter control lines 92 and 92A and the load condition lines 93, 93A, 94, and 94A can be quite long. This is because the regulated voltage level must sometimes be delivered to different parts of the MPU package, and advanced MPUs have package sizes that can be quite large.

In the implementation of FIG. 16, it is most likely that the routing of the signals 92A, 93A, and 94A must cross over or pass by the multiple data lines or I/O signal lines 91 wired to the MPU socket or pin pads. In this case, noise at area 95 from fast clock and data edges in the signal on the data lines or I/O signal lines 91 will couple in to the load condition and converter control signals 92A, 93A, and 94A. The impact of the noise in area 95 may thereby cause the signal quality of these signals to deteriorate and render the POL DCDC converter unstable or noisy. Noise may also arise in areas 96 from filters 34 or 34A. The impact of the noise in areas 95 and 96 may thereby cause the signal quality of these signals to deteriorate and render the POL DCDC converter unstable or noisy.

Figure 17:
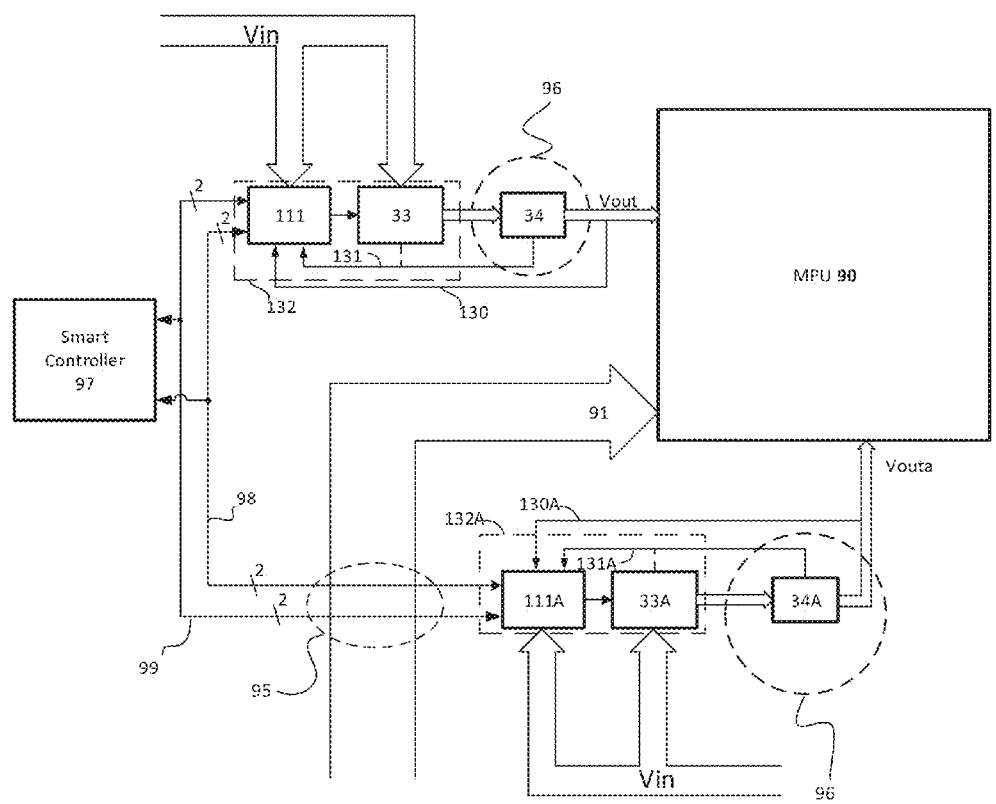
FIG. 17 depicts the layout of an N-phase noise resistant POL DCDC converter supplying power to an MPU.

FIG. 17 illustrates an approach that differentially encodes converter control and load condition signals—in either analog or digital format—that will allow the information from lines 92A, 93A, and 94A from FIG. 16 to pass by: noisy sub-systems, circuitry, or traces with fast edges; or inductors without being overly corrupted by noise. In this approach, load condition signals from multiple phases are encoded and sent back to N-phase smart controller 97. Noise is further ameliorated because the load condition signals are sampled and encoded close to their origin before they can be corrupted by noise.

FIG. 17 shows a similar layout of the PCB shown in FIG. 16 except a coding solution provided here is employed between the N-phase smart controller 97 and one or more gate drivers 111 and 111A. The arrangement shown in FIG. 13, where the encoding and decoding units are incorporated within the controller 115 may be employed here. Due to the differential signaling employed in FIG. 17, differential pairs 98 and 99 are more insensitive to noise coupling as they cross or pass near to noisy data or I/O lines 91 at area 95. While a PCB is shown in FIGS. 16 and 17, it could also be to a configuration where the components are on a single chip, for example, where the MPU and converter on are the same silicon.

A coding solution may be provided in FIG. 17 between the gate drivers 111 and 111A and corresponding power switches 33 and 33A. This may be in addition to or in the alternative of using a coding solution between DC controller and gate driver. With this arrangement, the power switches 33 and 33A are protected from the inductive noise from nearby filters at regions 96. As with previously described arrangements, the coding may include differential signaling including LVDS.

As shown above using drivers with coding of load condition signals 130, 131, 130A, 131A allows these sensitive signals to be routed relatively short distances along the PCB near the load. This reduces their exposure to noisy areas 91. There is still exposure for load condition signals 130, 131, 130A, 131A to the magnetic coupling from the inductor in filters 34 and 34A as before in FIG. 16 however if the gate drivers 111, 111A and power switches 33, 33A can be encapsulated as power stages 132, 132A then the current sensing and other sensing can happen under controlled conditions inside the package. This is depicted by the dashed line sections of load condition signals 131 and 131A.

FIG. 17 illustrates a further advantage of the encoding approaches described above. A pair of differential lines connect DC controller 97 and one or more gate drivers 111 and 111A. Notably, the number of lines needed with the present solution is a factor less than in the previous un-coded arrangements. This is illuminated by comparing FIGS. 16 and 17 which show an un-coded and coded solution, respectively. In FIG. 16, the number of traces needed for control loops in the two phase shown is 6 because there are two load condition signals and one converter control signal per phase. In FIG. 17, only 4 lines are needed to route the converter control and load condition signals. This difference in the number of required traces has two sources. First, the encoded signals contain information that was previously routed using two different analog signal lines. Secondly, as described previously with reference to FIG. 6, multiple phases can share the same feedback lines because in certain implementations the controller only needs feedback information from one phase at a time.

In N-phase designs with larger numbers of phases than what is shown in FIG. 17, this difference in the number of routing lines can have a major effect. Taking the example of an 8-phase system, an un-encoded implementation would need at least 17 lines whereas an encoded implementation would still need only 2-4 lines because all of the lines could be connected together on one or two differential serial buses. Even if separate clock and digital data lines are used, the number of lines would be less than the implementation in FIG. 16. This is a tremendous savings in PCB routing and leads directly to a reduction in IC package I/O pins and cost for the controller.

Figure 18:
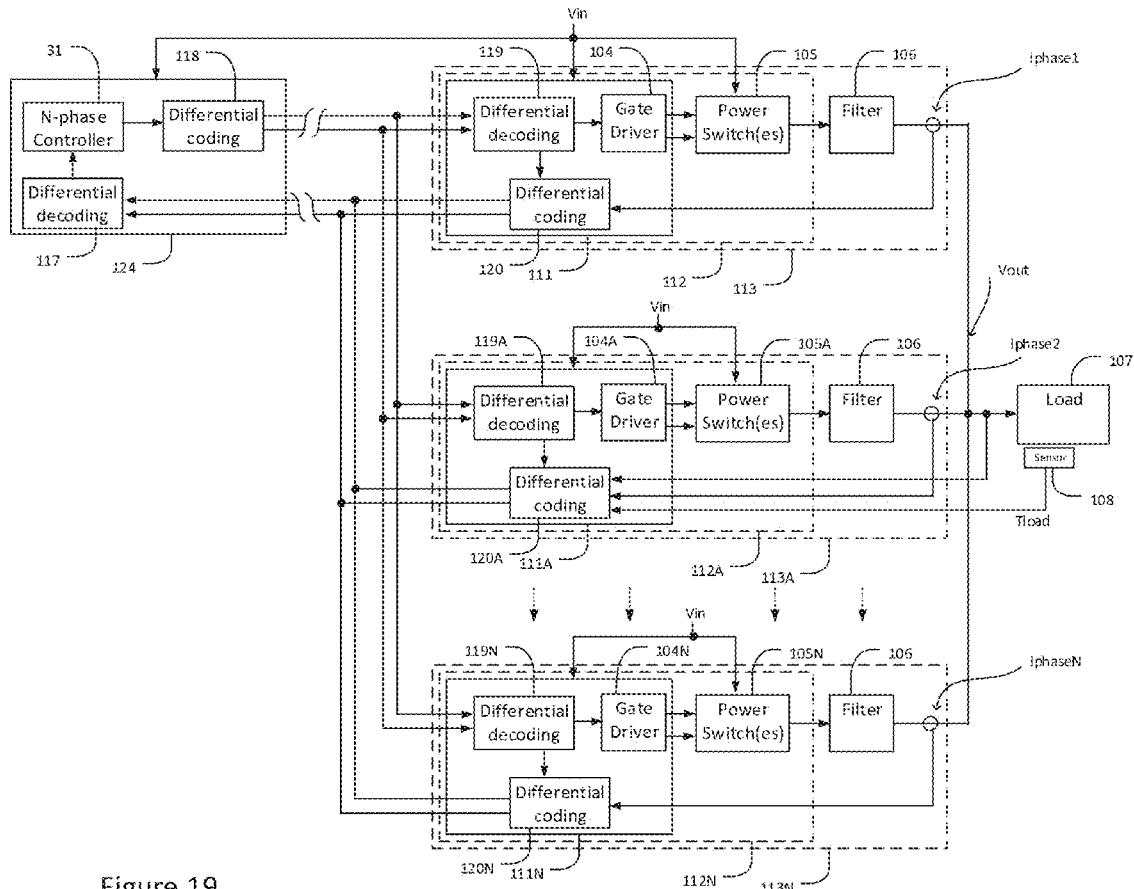
FIG. 18 depicts the block diagram of an N-phase POL DCDC converter using differential signaling to and from the N-phase controller.

As will already be noticed, the solution regarding PCB or chip configurations may also incorporate a multi-phase solution. For example, FIG. 18 shows the block diagram of the implementation of an N-phase DCDC Converter with differential digital signaling. All of the PWM/PFM/DE signals from the N-phase controller 124 have been coded with differential digital signaling at the output of block 118. Of course, the solution may employ coding for any number of phases.

In another arrangement, one, more or all of the feedback signals may be coded with differential digital signaling at the output of blocks 120, 120A . . . 120N as exemplified by FIG. 18. These blocks can be synchronized with differential decoding block to ensure that the proper phase is being sampled at the right time. In that case, the two buses are common for each phase from 1 to N phases. It shall be appreciated that coding in one or more places, and further selective coding, provides a solution for the design problems described herein. Thus, for example, combining coding at the DCDC controller, at the power switch and at the feedback signals protects from the types of noise discussed above with reference to FIG. 8 and FIG. 9.

Figure 19:
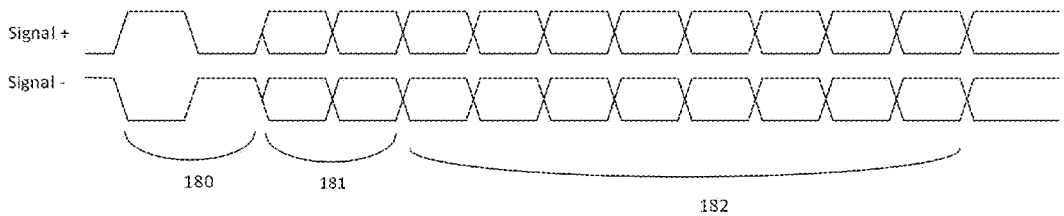
FIG. 19 depicts differential digital signaling of a multi-phase PWM waveform.

FIG. 19 shows one implementation of differential digital signaling where the clock 180 is embedded as are two bits for the phase number 181 and 8 bits of digital data proportional to the PWM/DE duty cycle or PFM pulse count 182.

A single PMIC configuration will also be described with respect to the present solution(s). Using LVDS coding, a single PMIC with many DCDCs on chip can supply multiple loads that are located remotely from the PMIC without regard for noisy circuits or buses in between the PMIC and the loads. Use of a single PMIC will allow for smaller PCB board area usage and lower system cost versus using several single channel POLs.

The solutions discussed, while not limited to a particular type of circuit, are also applicable to any type of power control system. For example, the solutions may be applied to bus DCDC converters, POL DCDC converters, or any power supply. The solutions may be applied in a PCB layout, in a single chip, or multi-die single chip arrangement. In another embodiment, the solutions may be applied to multi-phase DCDC converters. In still another embodiment, the solutions may be applied to PMICs. In yet another embodiment, the solutions may be applied to MOSFET driver ICs. In another embodiment, the solutions may be applied to power stage ICs or multi-chip modules also known as driver MOS or Dr. MOS. In another embodiment, the solutions can be applied to DCDC Buck, Boost or buck boost regulators.

Converter Controller and Driver

The problems described in the previous section regarding noise and layout constraints placed on DCDC converters can also be addressed through various controller and driver architectures, as well as the selective partitioning of controller and driver circuit blocks between different ICs and packages. These approaches and modifications thereof can improve converter stability, reduce circuit complexity, save area, and generally reduce a converter's susceptibility to noise. Selective partitioning, controller/driver architecture selection, and other solutions discussed in this section can be used in combination with or independently of the solutions described in the previous section to ameliorate the disclosed problems of noise corruption, noise generation, and general layout constrains.

Figure 20:
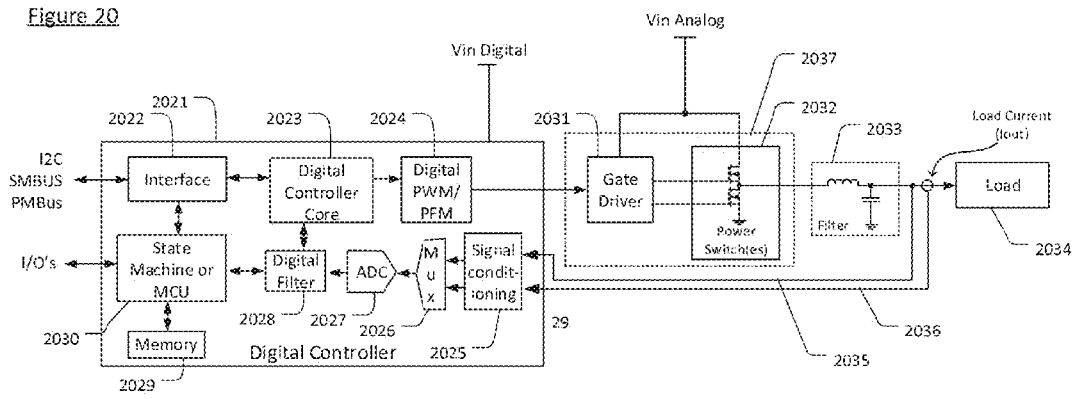
FIG. 20 depicts a digital controller coupled to a gate driver and power switches.

FIG. 20 depicts a component level view of a digitally controlled DCDC converter. In the figure, there is provided a digital controller 2021 including an interface 2022, a digital controller core 2023, and a digital PWM/PFM 2024. There is further provided a memory 2029, a state machine or MCU 2030, a digital filter 2028 and an ADC 2027. The controller can further include an analog signal conditioning circuit 2025 which improves the signal quality of the load condition signals before they are digitized by the ADC 2027. A multiplexer 2026 can also be used to allow the ADC to process the load condition signals sequentially if multiple signals are used. There is also provided a gate driver 2031, a power switch 2032 and a filter 2033. The filter is connected to a load 2034 and feedback lines 2035 and 2036 are connected to the signal conditioning circuit 2025 forming a portion of the overall control loop for the regulator.

As CMOS wafer fabrication processes increase in density, there is a desire to use more digital control loops to replace analog control loops. This is because the low voltage digital and mixed signal blocks in controller 2021 can be scaled using Moore's law on modern processes. However fine geometry CMOS processes do not serve to benefit power switch 2032 as much as the blocks in controller 2021. This is because the power factor of merit "FOM" of a power MOS switch 2032 has not improved as a result of shrinking process lithography. In addition, there are other analog blocks that may be handicapped by the limited voltage headroom that is available on denser CMOS process, and may include devices that do not shrink with process geometry. Examples of such analog blocks include the signal conditioning circuit 2025 for the load condition signals. Also, new silicon devices such as lateral DMOS power transistors have not benefited from being implemented on advanced CMOS, BiCMOS or BCD processes that can integrate the digital controller, gate driver and power switches as they have moved towards a denser process geometry. Finally, the maximum power supply voltage that can be applied to a circuit reduces as process geometries shrink.

Given the above constraints, it is sometimes desirable to separate the digital controller 2021 from the gate driver 2031 and power switches 2032 of FIG. 20 to utilize the best wafer fabrication process for each block. In such implementations, the controller 2021 is beneficially placed in a separate IC package from the gate driver 2031, power switches 2032 and filter 2033. It may also be beneficial to place the signal conditioning 2025 close to the load 2034, filter 2033 and switches 2032 since the process for the gate driver 2031 and switches 2032 may allow a larger supply voltage Vin Analog. In one implementation, the controller 2021, including one or more of the blocks shown, is provided in its own IC package. In addition, gate driver 2031 can be arranged in its own IC package. However, gate driver 2031 and power switches 2032 can also be are packaged together into a single IC package as a power stage or driver MOS 2037. The single IC package used can take on any of the characteristics described above with reference to FIGS. 3-5. Note that the partitioning arrangements discussed with reference to FIG. 20 can likewise be applied to a N-phase DCDC converter such as the one described above with reference to FIG. 6. Of course, in this situation the signals would be fed back to a digital N-phase controller in place of digital controller 2021.

The partitioning described above with reference to FIG. 20 is amenable to combination with many of the solutions described in the previous section. As described, there are certain benefits to partitioning circuit blocks of a converter between two integrated circuits. The previous section described additional benefits to partitioning circuit blocks in a converter. These included alleviating routing constraints and allowing a single controller to provide control signals to an N-phase converter system. Solutions applied to achieve or enhance the approaches described in the previous section can therefore be applied here to enhance the approached described in this section as well. For example, the signals routed between the separate integrated circuits can be encoded digitally and/or differentially. In particular, a sigma delta or delta sigma bit stream can be transmitted between a digital smart driver and a digital smart power stage. If such an approach were applied to encoding a load condition signal, a digital decimation filter to resolve the associated bit stream could be beneficially implemented on the dense geometry process used to fabricate the digital smart controller. This reduces the cost of implementing AD conversion for feedback signals in each phase in a multi-phase or multi-channel DCDC converter. Thus a digital smart driver employed in an N-phase arrangement will reduce costs by at least a factor of N. As an added advantage, a sigma delta modulator can impart a noise shaping function to its encoded signal. This may further reduce the wideband noise in the encoded Iout signal especially when the DCDC is in light load mode and the Iout signal is very small compared to the noise floor and digital or inductive noise spikes. Finally, it is also possible to use oversampling in the ADC or sigma delta modulator. This would further make the signaling robust and reduce wideband noise that may be present in the load condition signals.

Figure 21A:
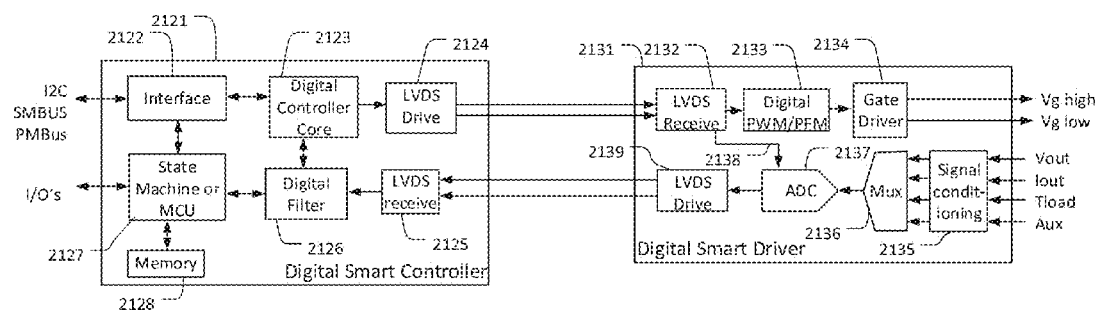
FIGS. 21A and 21B depict arrangements of a digital smart controller and driver.
Figure 21B:
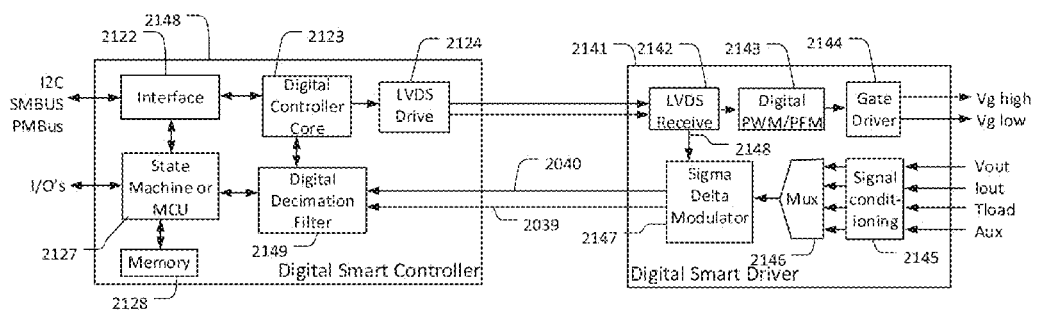

FIGS. 21A and FIG. 21B illustrate particular applications of the solutions described in the previous section with reference to FIG. 20. Additional configurations shall be described by arranging an ADC or a sigma delta or delta sigma modulator in a driver unit. Such an integrated driver can be called a digital smart driver or digital smart power stage. As shown in FIG. 21A, the digital smart driver is shown here digitizing load status signals Vout, Iout, Tload, and an auxiliary signal ("Aux"). However, the digital smart driver may digitize any signal associated with the driver. As will be shown, the use of a partial ADC, and in this case a sigma delta modulator, further reduces the die size and cost of digitizing the signal in comparison with a complete ADC being implemented in the gate driver or power stage.

Now turning to FIG. 21A in more detail, there is provided one implementation of differential signaling, using LVDS for example, between a controller 2121 and its corresponding gate driver 2134. Differential encoder 2124, here shown as an LVDS unit, is implemented in the same IC package as the controller 2121 in order to drive the converter control signals to the gate driver 2134. Differential decoder 2132 is needed prior to feeding the converter control signal to gate driver 2134.

The controller of FIG. 21A may also include an interface 2122 that receives signals in formats such as 12C, SMBUS, or PMBus. A digital controller core 2123 is the central signal processing block that acts on the filtered load condition signals and changes modes for instance between PWM and PFM or other modes. It also responds to out of bounds conditions such as over current and over voltage. As already discussed, an encoder, such as an LVDS encoder 2124 may be provided that outputs a coded signal. In the reverse direction, the controller 2121 may provide a decoder 2125 for the encoded load condition signals. A digital filter 2126 may further be provided to filter the decoded signals and provide them to a state machine or MCU 2127 and the digital controller core 2123. A memory 2128 may also be provided for the use of the MCU 2127 and to save configuration register settings that impact the functioning of the digital control loop.

In FIG. 21A there is shown an IC package containing a smart controller 2121 with controller 2127, differential encoder 2124 and differential decoder 2125. There is also shown an IC package containing a smart driver 2131 with gate driver 2134, decoder 2132, and encoder 2139. The decoder 2132 may be an LVDS receiver as shown. The digital PWM/PFM block 2133 is shown in this embodiment in the smart driver 2131. However, this block could be located in the digital smart controller 2121 instead. In these embodiments, the digital PWM/PFM block 2133 can take a serial bitstream and convert it to a PWM/PFM waveform. Smart driver 2131 can sample Vout, Iout sense, Tload, Aux, or any load condition signal and then encode them prior to sending them to smart controller 2121. Decoding of these signals is needed to restore them back to their optimal form to be processed by controller 2121. Both the smart controller and smart driver can be analog or digital in nature. Note that when the signals are digitally encoded, ADC 2137 can be provided in combination with multiplexer (MUX) 2136 to multiplex and encode the feedback signals. Analog signal conditioning circuit 2135 can also be implemented in this IC which is beneficially closer to the load and filter if the smart controller 2121 is located remotely from the smart driver 2131. Finally, smart driver 2131 can include a coupling 2138 between decoder 2132 and ADC 2137. Coupling 2138 can be used to transmit control signals that keep the ADC 2137 from converting signals while the rest of the circuits on smart driver 2131 are active. The load condition signals can thereby be accurately encoded without distortion from the other circuit blocks on smart driver 2131. In addition, if there is a clock embedded in the control signals, the sampling of the load condition signals can be synchronized to this clock for precise timing of the ADC 2137 sampling.

FIG. 21B illustrates a further refinement over FIG. 21A in that the smart driver 2141 of FIG. 21B includes a sigma delta modulator 2147 to digitize the load condition signals. The other components of the smart driver 2141 may remain the same as in the earlier figure including decoder 2142, digital PWM/PFM 2143 and gate driver 2144. In the reverse direction, there may also be included an analog signal conditioning block 2145, and a MUX 2146. In FIG. 21B, there is no additional encoder or decoder for the bitstream output of the sigma delta or delta sigma modulator for simplicity and cost reduction. Since the bitstream output 2040 and clock 2039 are digital signals, they may be less sensitive to noise coupling from nearby traces as previously described. However such LVDS coding and decoding could be implemented if desired in a particular implementation. Smart driver 2141 can also include a synchronization coupling 2148 serving a similar purpose to synchronization coupling 2138. A smart controller 2148 that can be used in combination with smart driver 2131 is also shown in FIG. 21B. Smart controller 2148 is distinguishable from smart driver 2121 because it includes digital decimation filter 2149 for resolving the bitstream sent from sigma delta modulator 2147 in addition to filtering the load control signals as in the digital filter 2125 in FIG. 24.

The solutions described with reference to FIG. 21A and FIG. 21B can be used in combination with the solutions described in the previous section. For example, the partitioning of sub-blocks into different integrated circuits can take on all of the variations described with respect to FIGS. 4-5 while still utilizing smart controllers 2148 and 2122 and smart drivers 2131 and 2141. As another example, the smart driver and smart controllers described can be applied in a PMU configuration in the variations described with reference to FIG. 7. Smart controllers 2148 and 2122 and smart drivers 2131 and 2141 can also be utilized in an N-phase converter environment. This is a particularly beneficial application because the digitized signals can be transmitted through the N-phase system at the proper time, and using a limited number of traces. smart controllers 2148 and 2122 and smart drivers 2131 and 2141 can also be implemented using any kind of coding described above such as differential, digital, LVDS. The controllers can also be utilized with embedded signals such as a clocks.

FIGS. 22-29 depict some of the possible implementations for smart controllers, smart drivers, and smart power stages that can be used with differential, digital, or differential digital encoding. Differential encodings do not require digital signals so they may be implemented with analog smart drivers and smart controllers. Note that any of the following smart controllers and smart drivers can be used in any combination so long as the proper encoders and decoders are selected to make the system compatible. For example, in an N-phase system, different driver types can be used and different controllers can be used if multiple phases are broken into different groups. Furthermore, the two paths between a particular controller and driver can use different kinds of signaling. The components of the illustrated systems can be implemented in a mixture of analog and digital forms. In addition, the smart controllers and smart drivers in FIGS. 22-29 could be implemented as single IC packages or each component could be a separate portion of a single integrated circuit.

Figure 22:
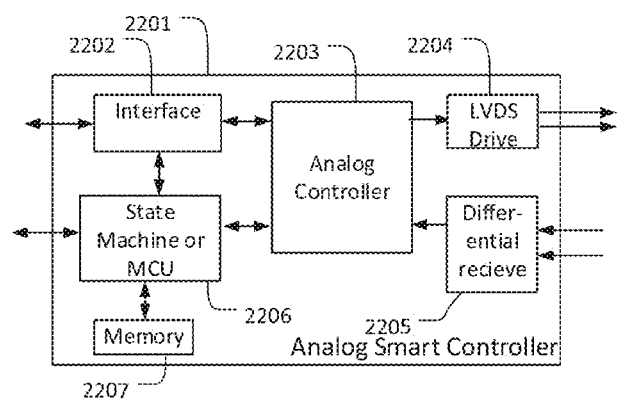
FIG. 22 depicts the block diagram of an analog smart controller.

FIG. 22 depicts an analog smart controller 2201 that can use a traditional analog controller 2203 where the feedback loop, compensation and modulation are all of an analog nature. Such analog smart controllers 2201 may or may not use a serial digital interface 2202 utilizing such standards as PMBus, SMBus or I2C to control, monitor and communicate with other converters or a host MPU. Analog smart controllers 2201 such as in FIG. 22 may also include an ADC to digitize the load condition signals or even the input voltage or input current to report back through the interface 2202. As shown, the analog smart controller 2201 sends out an encoded converter control signal from encoder 2204 and receives an encoded load operation signal to decode using decoder 2205. The analog controller 2203 can be controlled or monitored by a state machine or MCU 2206 which may work in combination with a memory 2207.

Figure 23:
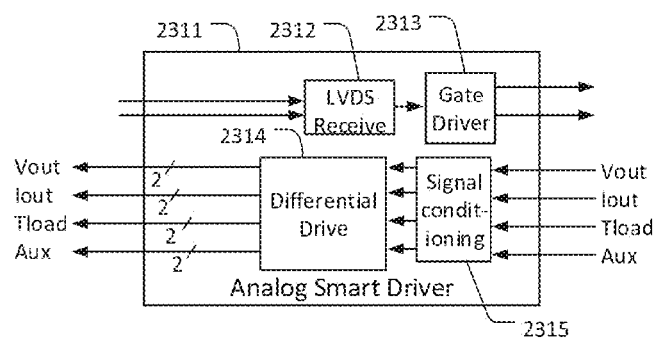
FIG. 23 depicts the block diagram of an analog smart driver.

FIG. 23 depicts a possible implementation of an analog smart driver 2311 that might be utilized with the smart controller 2201 of FIG. 22. The analog smart driver may have an LVDS decoder 2312 or other differential signal decoder for the control signal input, a gate driver 2313, analog signal conditioning 2315 and a differential encoder 2314 or other differential or digital drive to feedback the Vout, Iout, Tload, Aux or other load condition signals back to a controller.

Figure 24:
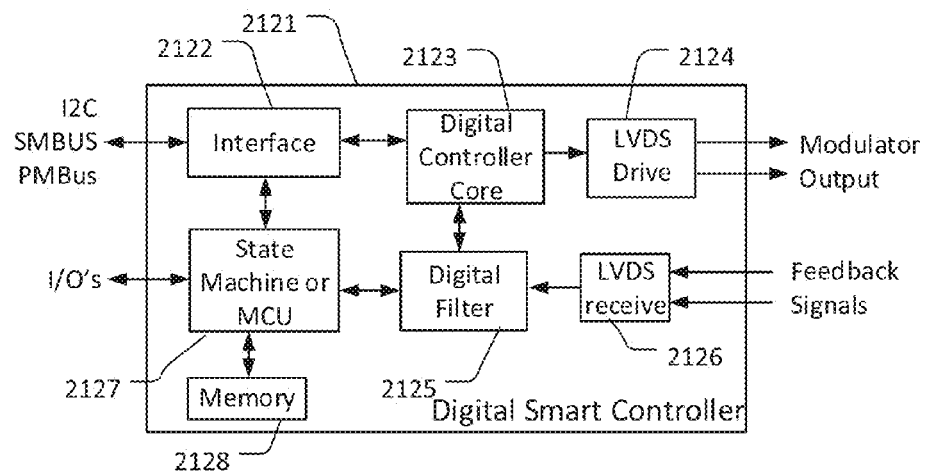
FIG. 24 depicts the block diagram of a digital smart controller.

FIG. 24 illustrates a digital smart controller 2121 that is aligned with the smart controller described in FIG. 21A. The controller utilizes a digital controller core 2123 and may be packaged as an IC. For the implementation depicted, the digital controller core output 2123 is LVDS coded by an LVDS encoder 2124. This allows the data to be communicated serially and additional information added to the data for the smart driver or smart power stage in to process in order to regulate the load. A major benefit of using a smart controller configured such as 2121 is that the blocks are mostly digital in nature and can take full advantage of the dense CMOS processes driven by Moore's law. In addition, compensation of the converter loop may be accomplished in the digital domain with a digital filter 2125 so the compensation coefficients can be modified during PCB design or on an ongoing basis via software or firmware. Similar to analog smart controller 2201, the digital smart controller 2121 can utilize a PMBus, SMBus or I2C interface 2122 to control, monitor and communicate with other converters or a host MPU. If the LVDS feedback signals from the smart power stage are in a digital format, then after the LVDS receive block 2126 they can directly be processed by the digital filter 2125.

Figure 26:
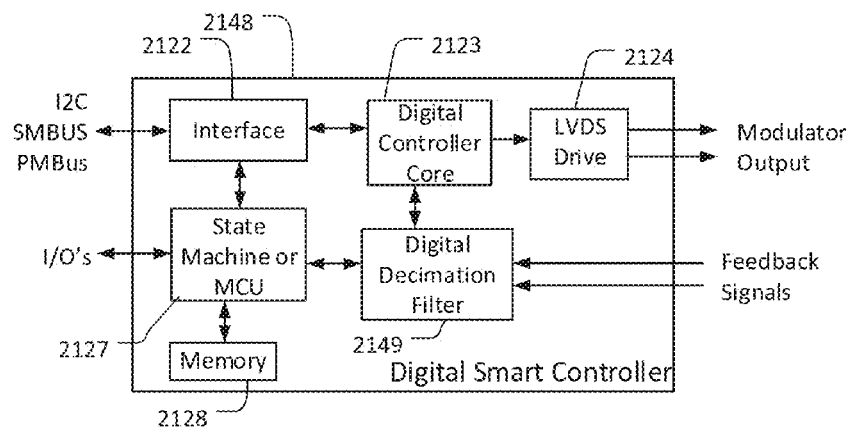
FIG. 26 depicts the block diagram of a digital smart controller with a decimation filter.

FIG. 26 illustrates a digital smart controller 2148 that is slightly different from that of FIG. 24 in that a digital decimation filter 2149 is used to complete the analog to digital conversion and filtering of the load condition signals or any other signals from a sigma delta modulator. As in FIG. 24, almost all of the blocks in such a digital smart controller can scale with process geometry and take advantage of Moores law. For FIG. 24 and FIG. 26, this benefit is especially important if multiple channels of DCDC conversion are included on one chip as in the PMIC or PMU of FIG. 7 and FIG. 29.

Figure 25:
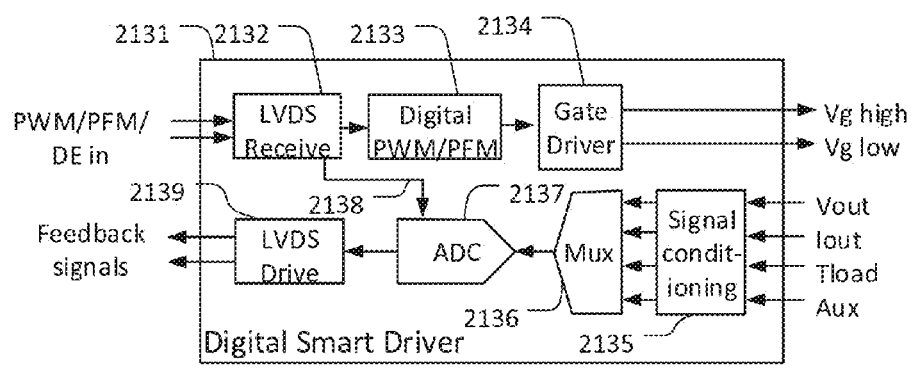
FIG. 25 depicts the block diagram of a digital smart driver.
Figure 27:
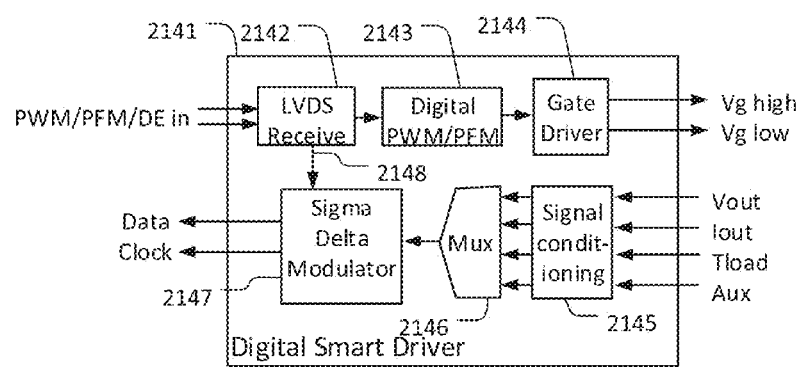
FIG. 27 depicts the block diagram of a digital smart driver with a sigma delta modulator.

FIGS. 25 and 27 depict smart drivers packaged in an IC or single die chip as illustrated by the solid border line. These drivers are aligned with the smart drivers described in FIG. 21A and FIG. 21B. As discussed, the use of an ADC imparts the benefit of significantly reduced circuit complexity in the driver in that serial data lines can be multiplexed. The use of single-ended or differential digital data to communicate between a digital smart controller and digital smart driver can offer additional benefits. If the converter control signals are PWM/PFM/DE inputs, and they are encoded in digital format, then after they are decoded, a digital PWM/PFM/DE block is all that is needed to feed the gate driver 2134 or 2144 and the power switch(es).

As previously mentioned, using a digital smart driver and communicating serial data allows a clock signal or other important control bits to be passed between the digital smart controller and digital smart driver. For example, a clock signal can be extracted from the converter control signal and used to precisely time events such as the sample frequency and exact sample window for the ADC 2137 or sigma delta modulator 2147. These signals can be extracted by the decoder on the smart controller and routed through coupling 2139. Controlling blanking intervals and over-sampling through the use of these important control bits can reduce the pickup of unwanted noise or noise spikes in the feedback signals. Clocking can also be used to adjust the dead time of the high side and low side gate drivers and thus the power switch(es).

Figure 28:
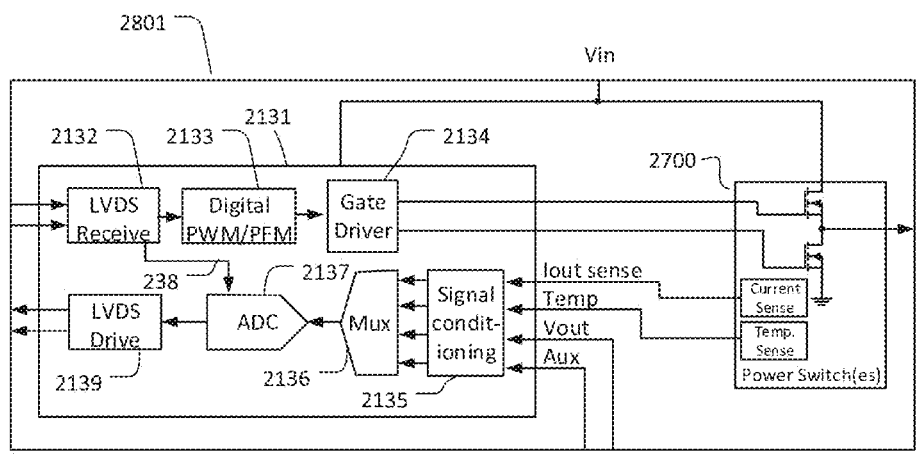
FIG. 28 depicts the integration of a digital smart driver, power switches, and sensing circuit into a single IC package called a digital smart power stage.
Figure 29:
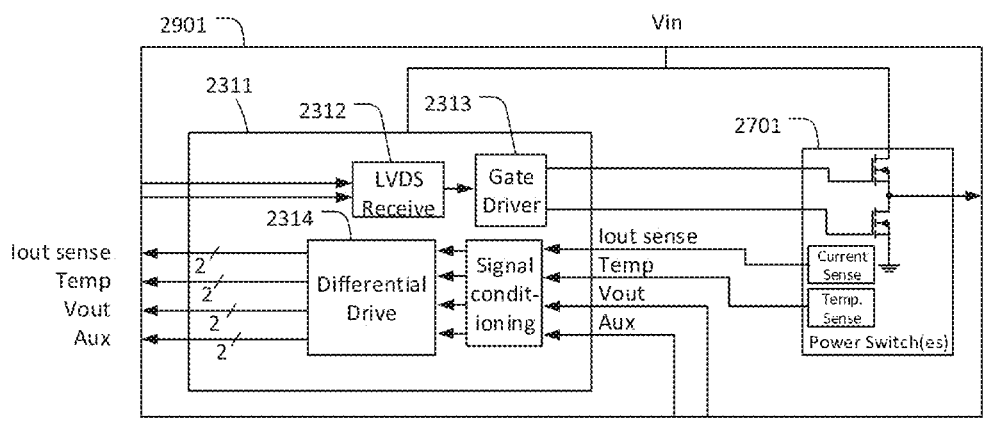
FIG. 29 depicts the integration of an analog smart driver, power switch, and sensing circuit into a single IC package called an analog smart power stage.

FIG. 28 depicts a digital smart driver 2131 and power switch(es) 2700 that are integrated in the same IC package 2801. As such, they may be integrated either monolithically or using co-packed dice of comprising the same or different semiconductor materials. This integration allows for a controlled environment in which to sample Iout using the previously described methods for current sensing such as through the use of Rdson, pilot FETs, or series resistors. If ADC 2137 or a sigma delta modulator is used to digitize Iout in this configuration, then the noise coupled in to the signal and the filter inductive coupling can be greatly reduced. Any of the smart drivers described previously can be integrated with power switch(es) 2700. For example, FIG. 29 depicts an analog smart driver 2311 integrated with power switch(es) 2700 in an IC package 2901 a similar manner. Such a configuration produces many of the attended benefits associated with FIG. 27.

Power Management Unit (PMU) or Power Management IC (PMIC)

Many solutions discussed above have dealt with situations in which a single converter regulates a supply for a single load. However, the operation of multiple converters to regulate one or more supples has also been discussed. For example, the N-phase system of FIG. 6 utilizes multiple regulators to regulate a single load. Also noted were situations in which multiple types of converters were needed in a given system to regulate supplies with different requirements. For example, the MPU in FIG. 16 required a multi-phase converter. In other cases, multiple converters can sometimes be integrated in the same package. This type of configuration was discussed previously with reference to FIG. 7. Multi-channel converters in a single IC package have been referred to here as power management ICs ("PMICs") or power management units (PMUs).

Figure 30:
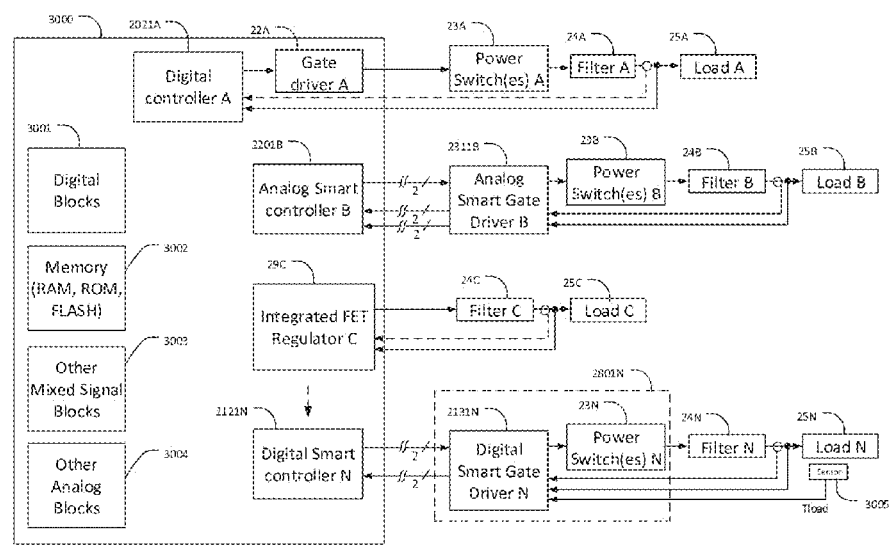
FIG. 30 depicts the block diagram of a PMIC with a mix of on chip converter elements.

PMUs and PMICs where discussed above with references to FIG. 7. More detail is provided by FIG. 30. Note that in the following discussion a reference to PMUs or PMICs alone refers to both PMUs and PMICs. FIG. 30 illustrates a PMU 3000. Note that the term DCDC converter shall refer to the controller, gate drive, power switch(es) and filter in any configuration for a particular load. For example, DCDC converter C is comprised of integrated FET regulator 29C and filter 24C which drive load 25C and so on. Note that the PMU includes separate DCDC converters to provide power for different loads each with different requirements in terms of voltage and current. The main characteristic of PMU 3000 is that it includes multiple converters. However, it does not need to contain the same portions of each DCDC converter for the different channels. PMU 3000 includes power switches within integrated FET regulator 29C for one of the channels; a digital controller 2021A and gate driver 22A but not power switches for DCDC converter A; and only an analog smart controller 2201B or digital smart controller 2121N for DCDC converters B and N respectively. The PMU also includes various functional blocks, such as digital blocks 3001, memory (RAM, ROM, or Flash) 3002, mixed signal blocks 3003, and/or analog blocks 3004. As previously discussed, the use of smart controllers 2201B and 2121N, and smart drivers 2311B and 2131N; or smart power stages 2801N allows those loads 25B and 25N to be located a longer distance from PMU 3000 when laid out on a PCB and be less sensitive to noise coupling.

As described in the section above, the use of smart partitioning of blocks when using digital loop DCDC converters allows low voltage dense CMOS to follow Moore's law while the higher voltage components such as the driver analog signal conditioning and power switches to be implemented in another higher voltage IC. For the case of a PMU or PMIC such as FIG. 7 or 30 if most or all of the DCDC converters are digital with smart partitioning such as shown in FIG. 21A or 21B then the PMU or PMIC 3000 can integrate much more digital circuitry such as blocks 3001 and 3002 and thereby produce a savings in terms of IC die area as the PMU can be fabricated with the latest dense digital wafer process.

As discussed in detail above, converters can radiate switching noise that can impact other circuits in a PCB layout. In addition, several of the signals in a converter can be sensitive to noise coupled into the converter from nearby sub-circuits, high speed digital buses, and other noise sources. This disclosure provides a PMIC or PMU that is able to communicate between one or more controllers, drivers, power switches, filters and loads in a way to reduce radiated noise and also reduce sensitivity of this controller. This solution may be applied to power stage ICs, multi-chip modules, and N-phase converters.

A noise resistant PMU or PMIC can involve the encoding and decoding of signals between the controller and other major blocks of a converter. More particularly, the signals can be encoded and decoded differentially and/or digitally using various types of noise resistant coding as described above. As described above, the use of differential signaling or digitally coded signaling allows a converter controller to be located much farther away from the gate driver, power switch(es), filter and load than would otherwise be possible because the signals have less sensitivity to being interfered with or corrupted by nearby noise sources. In the PMU or PMIC context, this means that multiple controllers associated with different driver stages and loads can be grouped together in the same area even if the resulting concentration of controllers increases the average distance from each controller to its corresponding driver. PMIC or PMU can be formed as System on Chips (SoCs) or as PCB chip sets. Further, the encoder and decoders may be positioned off the SoC or single chip in order to simplify chip design. The concept behind PMIC and PMU solutions described herein can also be applied not only to a PCB layout but also to an SOC.

All of the encoding schemes described elsewhere in this specification can be applied to any converter used in a PMIC or PMU solution. In particular, LVDS may be used for any signals on the PMIC or PMU, and specifically may apply to a control signal carrying a PWM/PFM/DE signal output from the controller IC package. LVDS may also be used for the load condition signals such as feedback signals Vout, Iout sense and Tload from the components of converter located near the load that are fed back to the controller IC package. The usage of analog differential signaling or LVDS may be applied to, but not limited to analog, PWM, PFM, DE serial digital data, sigma delta or delta sigma modulator bit streams, or PDM formatting. Using LVDS coding in a PMIC allows a single PMIC with many converters to supply multiple loads that are located remotely from the PMIC without regard for noisy circuits or buses in between the PMIC and the loads. Use of a single PMIC may allow for smaller PCB board area usage and lower system cost versus using several single channel POLs. Note that many of the other encoding schemes offer similar advantages and, as mentioned previously, can be used in the PMIC and PMU context. Furthermore, individual converters that are implemented in a PMU or PMIC context can use a different type of encoding from other converters in that same PMU or PMIC.

Figure 31:
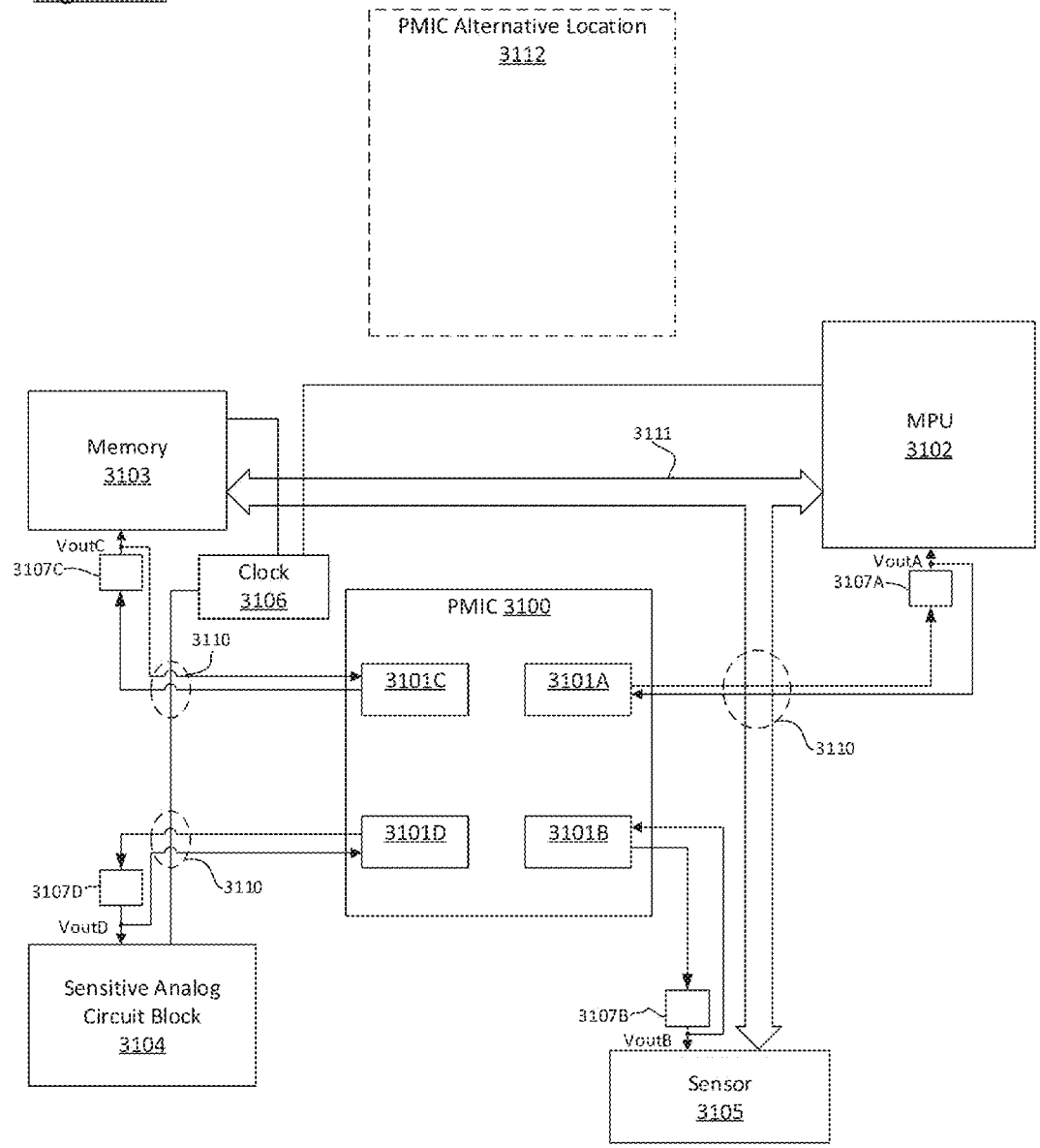
FIG. 31 depicts the layout and PCB routing of a single PMIC and the noise sensitive areas as a result.

FIG. 31 illustrates how a PMIC or PMU configuration contributes to save space and decreased layout constraints. PMICs reduce and centralize consumed PCB area and thereby decrease layout constrains and the cost for power delivery in systems where many POL converters are used. FIG. 31 shows a single PMIC that has integrated four integrated FET regulators 3101A-D into one IC package 3100. For applications in which a PCB must remain small such as in portable electronics, the current required by each component in the system is low so integrated FET regulators with on chip power switch(es) can be used. Components such as MPU 3102 and memory 3103, and more sensitive components like sensitive analog 3104 and sensor 3105, will need filter circuits placed as close to their regulated DC inputs as possible. They are illustrated in the figure as filters 3107A-D. Additional noise filtering can also be laid out next to the load as needed.

Although external filters are generally still required, integrating a majority of the converter components into PMIC 3100 still provides a significant layout advantage. However, condensing all of the components into a specific portion of the PCB results in the signal lines for the converters needing to cross noisy circuit areas marked 3110 in the figure. The noisy areas can be caused by clock lines carrying signals with fast edges generated by clock 3106 or data lines also having signals with fast edges such as data bus 3111. In addition, as mentioned before but not depicted in FIGS. 31-33 inductive coupling from filters 3107A-D may also couple into the sensitive signals. Finally, it would be possible to include integrated filters on the PMIC through the use of MEMS inductors or other similar technologies. These approaches would be most suitable for situations in which the PMIC was particularly close to the load or in which the load in question was less sensitive to noise.

In systems such as depicted in FIG. 31 there are two options for placing the filters for each DCDC converter. In one option the filter 3107A-D could be placed next to the PMIC 3100 IC package. This arrangement has the advantage that the load condition signals would be short PCB traces and less likely to be affected by nearby noise sources as described above. However, this choice of filter placement is disadvantageous if the load is at a remote area of the PCB far from the PMIC 3100. In such a situation, the filtered DC output voltage may pick up noise as it passes noisy areas 3110. In addition, if the DCDC converter 3101A-D output current is large, then the PCB trace must be made wide to reduce parasitic resistance. The second option would be to place the filters 3107A-D as shown in FIG. 31 close to the load. The drawback as mentioned above is the sensitivity of the signal lines such as the load condition signals when crossing or being laid out near noisy areas 3110.

As shall be appreciated from FIG. 31, the PMIC is centrally located in a hub and spoke type arrangement where the PMIC forms the hub and the power lines form the spokes. This is to minimize the number of lines that cross over noisy areas such as data bus 3111. For example, if the PMIC were located on an outer periphery of the circuit elements shown, such as the alternative location shown in dashed lines 3112, then the PMICs signal lines would cross over more noisy areas as they would all need to cross both the clock line created by clock 3106 and data bus 3111.

In higher power systems, it would not be practicable to have power switches for each of the converters on chip in the PMIC as shown in FIG. 31. In most cases, the power dissipation on the PMIC chip would be intolerably high and the resulting temperature would be too high. A solution to this problem in FIG. 32 is to have power switch(es) or a combination of gate drivers and power switch(es) or power stages 3201A-D remote to the PMIC 3200 placed close to the components to which they are providing power.

Figure 32:
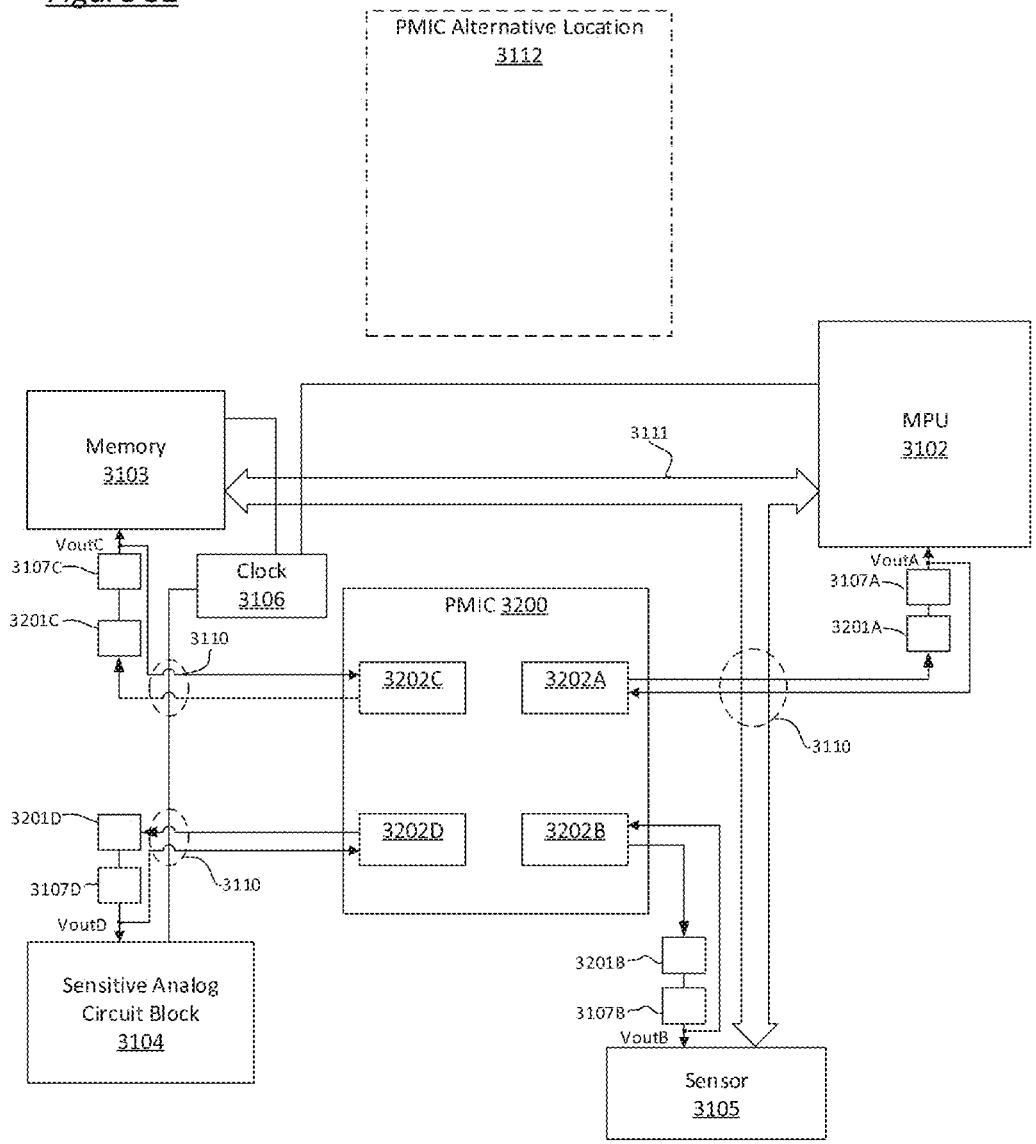
FIG. 32 depicts the layout and PCB routing of a single PMIC with remote power stages to supply power to the same loads in FIG. 31.
Figure 33:
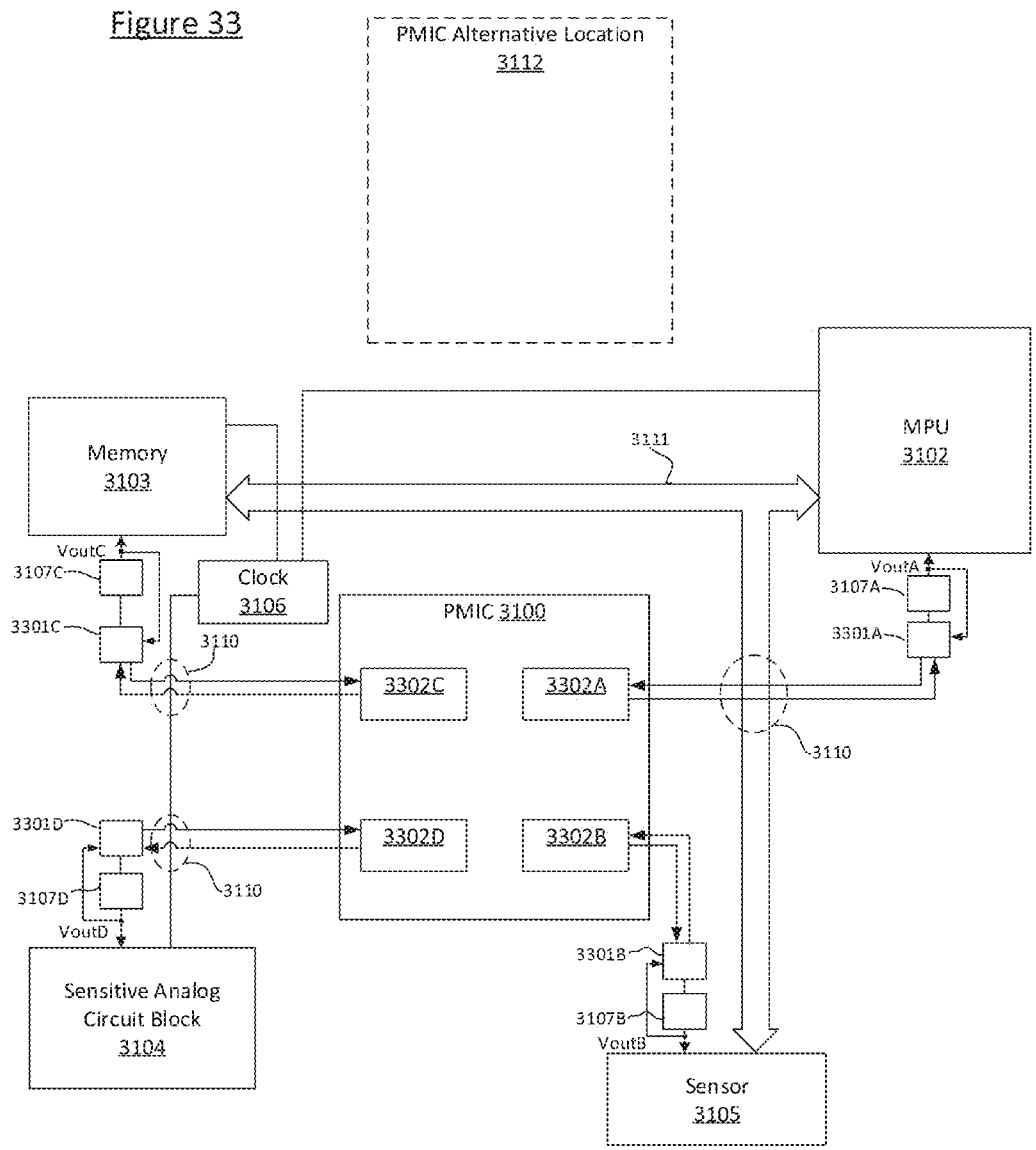
FIG. 33 depicts the layout and PCB routing of a single PMIC with remote smart power drivers or power stages to supply power to the same loads in FIG. 31 to reduce the layout's sensitivity to noise generation and coupling.

To simplify the drawings in FIG. 32 and FIG. 33 these three configuration options for gate driver and power switch or power stage described above from FIG. 7 are shown as a single block 3201A-D in FIGS. 32 and 3301A-D in FIG. 33. Similarly, for simplicity in FIG. 32 and FIG. 33, the load condition signals such as Iout, Vout and Tsense are depicted as a single signal line connected to VoutA-D. Finally, also illustrated in FIG. 32 as filters 3107A-D. Note that with dis-integrated gate drivers or power switch(es) the integrated FET regulators 3101A-D from FIG. 31 will commensurately need to be replaced with integrated controller and gate driver circuit blocks or integrated controllers only 3202A-D. Although this solution alleviates problems with high power consumption on the PMIC, it also exacerbates problems with noise coming from noisy areas 3110. The Iout signal can no longer be detected locally at the PMIC 3200 so remote Iout sensing is required at each of the components. As a result, one of the most delicate signals in the control loop for each converter must be routed through extremely long traces where it is corrupted by noise. The solution presented in FIG. 32 is therefore insufficient.

FIG. 33 illustrates a solution to the problem illustrated above in which gate drivers, power switches or power stages 3201A-D are replaced with smart power stages 3301A-D and the integrated controller and gate driver circuit blocks 3202A-D are replaced with smart controllers 3302A-D. The smart power stages 3301A-D may be analog or digital as described previously. The smart controllers 3302A-D communicate back and forth to the smart power stages 3301A-D using differential encoding (such as LVDS) or other methods of differential encodings, digital coding, or differential digital signaling. Indeed, any of the coding methods discussed above with reference to a single converter can be applied to multiple converters in a PMIC, though each converter in a PMIC does not need to use the same encoding scheme, and each can use a different scheme.

The solution shown in FIG. 33 allows a single PMIC to perform DCDC conversion with several loads, some of which have higher power or larger Iout and or tighter accuracy. It also allows the PMIC to communicate with remotely located smart drivers. In FIG. 33, smart controllers 3302A-D and smart power stages 3301A-D can be implemented in an analog approach as described previously and could also be implemented digitally. It shall also be noted that the PMIC in this solution can be placed almost anywhere since the noise is mitigated, thereby freeing designers to design without significant noise problems, and thereby eliminating duplicitous circuits or odd rerouting or placement of components. The PMIC could indeed be placed in the periphery 3112 or anywhere a designer wanted.

The solution shown in FIG. 33 can likewise be used with any combination of the various controller and driver architectures discussed above, as well as the selective partitioning of controller and driver circuit blocks between different ICs and packages discussed above. For example, the digital smart power stage could include a sigma delta modulator to digitize the load condition signals and a digital smart controller having a decimation filter to resolve the bit stream from the smart driver. The PMIC and smart power stage could then be implemented on different processes in which the power stage was implemented on a process amenable to high power circuits and the PMIC was implemented on high density process that was amenable to digital logic. As another example, the combination of a digital smart driver 2131 or 2141 like those in FIGS. 21A, 21B, 25, and 26 and separate power switch(es) could be used can be used in place of smart power stages 3301A-D. Likewise, an analog smart driver 2311 such as those described with reference to FIG. 23 could likewise be utilized instead of the digital smart driver 2131 or 2141. Note that the implementation in FIG. 33 can likewise be used with configurations communicating with serial data that allow a clock signal or other important control bits to be passed between the smart controllers 3302A-D and smart power stages 3301A-D. For example, a clock signal can be extracted and used to precisely time events such as the sample frequency and exact sample window for any ADCs or sigma delta modulators in smart power stages 3301A-D.

While the specification has been described in detail with respect to specific embodiments, it will be appreciated that those skilled in the art, upon attaining an understanding of the foregoing, may readily conceive of alterations to, variations of, and equivalents to these embodiments. The solutions described are not limited to a particular type of circuit, but are also applicable to control systems in general. For example, the present solution may be applied to DCDC converters or regulators, and AC or DC power supplies.

These and other modifications and variations to the present solution may be practiced by those of ordinary skill in the art, without departing from the spirit and scope of the present solution. Furthermore, those of ordinary skill in the art will appreciate that the foregoing description is by way of example only, and is not intended to limit the solution. Thus, it is intended that the present subject matter covers such modifications and variations.

What is claimed is:

1. A power supply comprising:
a non-isolated DC/DC converter supplying a regulated DC voltage to a load including:
a power switch driven by a smart gate driver;
a control loop carrying a load condition signal and a control signal; and
a controller that generates the control signal responsive to the load condition signal;
wherein:
the controller is located on a first integrated circuit package;
the smart gate driver is located on a second integrated circuit package;
an analog to digital converter located on the second integrated circuit package;
an encoder located on the first integrated circuit package, the encoder encoding the control signal and embedding a synchronization signal in the control signal, the synchronization signal providing a precise timing window for timing and sampling of the load condition signal; and
a decoder located on the second integrated circuit package, the decoder decoding the control signal and providing the synchronization signal to the analog to digital converter; and
the load condition signal is encoded on the second integrated circuit package in proximity to the load to reduce noise sensitivity on the control loop between the first and second integrated circuit packages,
the encoded load condition signal is decoded by a second decoder on the first integrated circuit package prior to being passed to the controller.

2. The power supply of claim 1, wherein the load condition signal is encoded using a noise insensitive coding method, comprising one or more of: a differential encoding, a low voltage differential signaling (LVDS), a frequency shift keying (FSK), a return to zero, and a spread spectrum.

3. The power supply of claim 1, further comprising:
a second encoder on the first integrated circuit package, to encode the control signal, which is then decoded on the second integrated circuit package using a noise insensitive coding method .

4. The power supply of claim 1, further comprising:
the encoder comprises a delta sigma modulator located on the second integrated circuit package, the delta sigma modulator encoding the load condition signal, and producing a bit stream that contains the load condition signal;
the second decoder comprises a decimation filter located on the first integrated circuit package, the decimation filter being used to resolve the bit stream.

5. The power supply of claim 1, further comprising:
the decoder being a digital pulse generator for decoding a digital bit stream from the controller and producing a modulated signal for a gate driver;
the digital pulse generator is located on the second integrated circuit; and
the modulated signal is a pulse width modulated signal or a pulse frequency modulated signal.

6. The noise resistant DC to DC converter of claim 1, further comprising:
a second channel including a second smart gate driver and a second controller, the second channel to provide one of: a multiphase controller for the load, and the second controller for a second load;
wherein the second controller is in the first integrated circuit package.

7. An apparatus comprising:
a converter for supplying a power from an input to a load;
a feedback path for controlling the converter, at least a portion of the feedback path carrying a sense signal representative of one of a load current or a load voltage;
a decoder for decoding an encoded sense signal to produce a decoded sense signal prior to the decoded sense signal being passed to a controller, the decoded sense signal being used to generate a control signal to control the converter; and an encoder for encoding the sense signal to produce the encoded sense signal;

wherein the decoder is located on a first integrated circuit package and the encoder is located on a second integrated circuit package, the second integrated circuit package placed in proximity to the load and comprising a smart gate driver including the encoder and a gate driver, to reduce noise sensitivity on the feedback path;

the encoder being an analog to digital converter located on the second integrated circuit package;

a third encoder located on the first integrated circuit package, the third encoder encoding the control signal and embedding a synchronization signal in the control signal, the synchronization signal providing a precise timing window for timing and sampling of the sense signal; and a second decoder located on the second integrated circuit package, the second decoder decoding the control signal and providing the synchronization signal to the analog to digital converter;

the first integrated circuit package and the second integrated circuit package comprising a non-isolated DC/DC converter supplying a regulated DC voltage to the load.

8. The apparatus of claim 7, wherein:

the feedback path additionally carries a second sense signal, the second sense signal related to a second power switch associated with a second load; and the encoder embeds the sense signal and the second sense signal in the encoded sense signal.

9. The apparatus of claim 7, wherein the encoder utilizes a noise resistant encoding comprising one or more of: a differential encoding, a low voltage differential signaling (LVDS), a frequency shift keying (FSK), a return to zero, and a spread spectrum.

10. The apparatus of claim 7, further comprising:

the analog to digital converter being a delta sigma modulator located on the second integrated circuit package, the delta sigma modulator encoding the sense signal, and producing a bit stream that contains the sense signal;

a decimation filter located on the first integrated circuit package, the decimation filter being used to resolve the bit stream.

11. The apparatus of claim 7, further comprising:

a second power converter for supplying power to the load; and a second encoder for encoding a second sense signal;

wherein the first and second encoders encode the first and second sense signals to be out of phase such that they can be transmitted serially.

12. The apparatus of claim 11, wherein the first and second sense signals are encoded and transmitted serially on one of: a single conductor circuit trace, or on a single pair of differential circuit traces.

13. The apparatus of claim 7, further comprising:

the decoder being a digital pulse generator for decoding a digital signal and producing a modulated signal for a gate driver; and a power switch controlled by the gate driver and coupled between the input and the load;

the digital pulse generator, a gate driver, and the power switch are located on the second integrated circuit; and the modulated signal is a pulse width modulated signal or a pulse frequency modulated signal.

14. A method for controlling a non-isolated DC-DC converter comprising:

generating a load condition signal and a control signal;

generating the control signal responsive to the load condition signal using a controller, the controller being implemented on a first integrated circuit package;

encoding the control signal on the first integrated circuit package using an encoder;

embedding a synchronization signal in the control signal using the encoder, the synchronization signal providing precise timing window for timing and sampling of the load condition signal;

driving a power switch to drive a load using a smart gate driver including a gate driver and a second encoder, the smart gate driver located on a second integrated circuit package in proximity to the load;

encoding the load condition signal on one of the second integrated circuit package and a third integrated circuit co-packaged with the second integrated circuit package, the encoding of the load condition signal to reduce noise sensitivity of the load condition signal; and decoding the load condition signal on the first integrated circuit, and passing the decoded load condition signal to the controller;

decoding the control signal using a decoder on one of the second integrated circuit and a fourth integrated circuit co-packaged with the second integrated circuit; and providing the synchronization signal from the decoder to a control circuit located on one of the second integrated circuit and the fourth integrated circuit;

thereby enabling the non-isolated DC/DC converter to supply a regulated DC voltage to the load.

15. The method of claim 14, wherein the encoding of the load condition signal is a noise resistant encoding comprising one or more of: a differential encoding, a frequency shift keying (FSK), a return to zero, and a spread spectrum, and a low voltage differential signaling (LVDS) encoding.

16. A multi-channel noise resistant non-isolated DC to DC converter to drive a plurality of loads comprising:

a plurality of channels, each channel comprising:

a power switch used to supply a regulated DC voltage to a load, the power switch driven by a smart gate driver, the smart gate driver including a gate driver and an encoder;

a control loop carrying a load condition signal and a control signal; and a controller located on the control loop to generate the control signal based on the load condition signal;

the controllers for the plurality of channels comprising a power management integrated circuit (PMIC) multi-channel converter in a single integrated circuit package;

the smart gate drivers for each of the plurality of channels located in one or more additional integrated circuit packages, separate from the first integrated circuit package, each of the smart gate drivers driving a separate one of the plurality of loads;

the load condition signals for the plurality of channels encoded on a respective one of the one or more additional integrated circuit packages associated with a respective smart gate drivers in proximity to a respective load to reduce noise sensitivity on each control loop, the load condition signals decoded on the first integrated circuit package prior to being passed to an associated controller;

each of the one or more additional integrated circuit packages including a decoder;

a first encoder encodes a control signal and combines the control signal with a synchronization signal, the synchronization signal providing a precise timing window for timing and sampling of the load condition signal; and the decoder decodes the control signal and provides the synchronization signal to a second encoder.

17. The multi-channel noise resistant non-isolated DC to DC converter of claim 16, wherein the first encoder comprises a delta sigma modulator and the decoder comprises a decimation filter.

18. The multi-channel noise resistant non-isolated DC to DC converter of claim 16, further comprising in at least one channel, the power switch comprising:
   a first power switch for providing a current signal to the load during a first phase, the first power switch being controlled via the control signal;
   a second power switch for providing a second current signal to the load during a second phase;
   a second signal for controlling the converter via the second power switch, the second signal being a second converter control signal; and
   the first and second converter control signals are digital encodings of PWM signals.

19. The multi-channel noise resistant non-isolated DC to DC converter of claim 16, wherein the second encoder utilizes a noise insensitive coding method, comprising one or more of: a differential encoding, a low voltage differential signaling (LVDS), a frequency shift keying (FSK), a return to zero, and a spread spectrum.

20. The multi-channel noise resistant non-isolated DC to DC converter of claim 16, wherein for at least one of the channels the decoder for the control signal, a digital pulse width modulation (PWM) and a pulse frequency modulation (PFM) block, the gate driver, a load condition signaling, an encoder for encoding the load condition signal, and the power switch are integrated in a single integrated circuit package.

21. The multi-channel noise resistant non-isolated DC to DC converter of claim 16, further comprising:
   the decoder comprises a digital pulse generator for decoding a digital bit stream generated by the first encoder and producing a modulated signal for the gate driver;
   the digital pulse generator and a second decoder are located on the first integrated circuit package; and
   the modulated signal is a pulse width modulated signal or a pulse frequency modulated signal.

22. The multi-channel noise resistant non-isolated DC to DC converter to claim 16, wherein two or more of the plurality of channels are coupled to a single load to provide multiphase power for the single load.

* * * * *